United States Patent [19]

Hosokawa et al.

[11] Patent Number: 5,142,343
[45] Date of Patent: Aug. 25, 1992

[54] ORGANIC ELECTROLUMINESCENCE DEVICE WITH OLIGOMERS

[75] Inventors: Chishio Hosokawa; Tadashi Kusumoto; Hisahiro Higashi, all of Chiba, Japan

[73] Assignee: Idemitsu Kosan Co., Ltd., Tokyo, Japan

[21] Appl. No.: 667,386

[22] PCT Filed: Aug. 16, 1990

[86] PCT No.: PCT/JP90/01043
§ 371 Date: Mar. 21, 1991
§ 102(e) Date: Mar. 21, 1991

[87] PCT Pub. No.: WO91/03142
PCT Pub. Date: Mar. 7, 1991

[30] Foreign Application Priority Data

Aug. 18, 1989 [JP] Japan ................... 1-211399

[51] Int. Cl.⁵ ............................................ H01L 33/00
[52] U.S. Cl. ............................................ 357/17; 357/8
[58] Field of Search ................... 357/17, 8, 16

[56] References Cited

U.S. PATENT DOCUMENTS

| 4,720,432 | 1/1988 | Van Slyke et al. | 357/8 |
| 4,877,852 | 10/1989 | Tanaka et al. | 526/256 |
| 4,939,556 | 7/1990 | Eguchi et al. | 357/8 |

FOREIGN PATENT DOCUMENTS

| 0292905 | 5/1988 | European Pat. Off. |
| 3800904 | 9/1988 | Fed. Rep. of Germany |
| 3717668 | 12/1988 | Fed. Rep. of Germany |
| 61-55183 | 3/1986 | Japan |
| 63-133682 | 6/1988 | Japan ................... 357/8 |
| 63-205316 | 8/1988 | Japan |
| 64-20270 | 1/1989 | Japan |

OTHER PUBLICATIONS

Baughman et al., "The Structure of a Novel Polymeric Material: Acceptor-Doped Poylyaniline," *Synthetic Metals*, 25(1988), pp. 121-137.

Garnier et al., "Conjugated Poymers and Oligomers as Active Material for Electronic Devices," *Synthetic Metals*, 28(1989) pp. C705-C714, C729-C734.

Yokoyama, "Basic Probelms in Materials for Organic Photoreceptor," *Electron Photograph Gaukaishi*, vol. 25, No. 3, pp. 62-69.

Adachi et al., "Blue Light-Emitting Organic Electroluminescent Devices," *Appl. Phys. Lett.* 56(9), 26 Feb. 1990, pp. 799-801.

*Primary Examiner*—William Mintel
*Attorney, Agent, or Firm*—Frishauf, Holtz, Goodman & Woodward

[57] ABSTRACT

An organic electroluminescence device having a high brightness of 50 cd/m² or more and a luminous efficiency of 0.02 lm/W or more, wherein an organic semiconductor zone and an organic insulator zone are sandwiched between electrodes, the organic insulator zone contains an organic light emitting area, and the above organic semiconductor zone comprises electroconducting oligomer. The organic electroluminescence device is capable of emitting light in a plane, shows a stable emission of light, and further can be easily prepared.

13 Claims, 6 Drawing Sheets

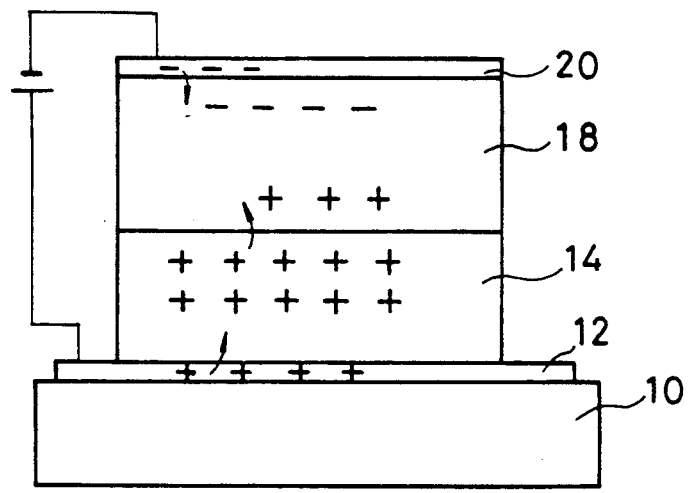
F I G. 3
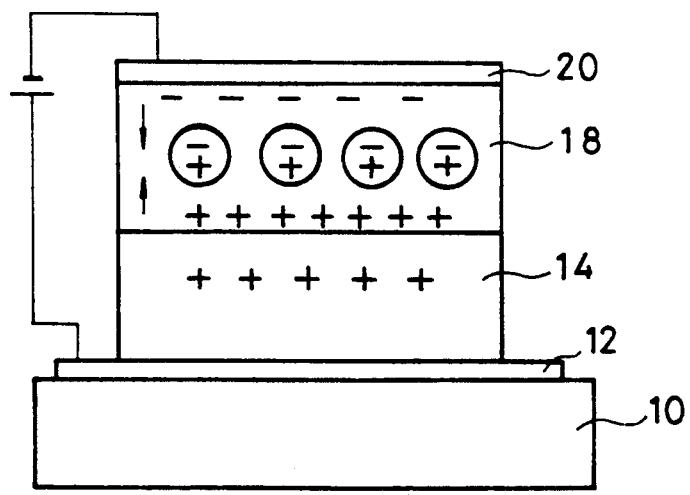
F I G. 4

ORGANIC ELECTROLUMINESCENCE DEVICE WITH OLIGOMERS

DESCRIPTION

1. Technical Field

The present invention relates to an organic electroluminescence device, that is, it is concerned with organic EL device.

2. Background Art

As the above organic EL device, conventionally, there has been an EL device described in U.S. Pat. No. 3,995,299. Said organic EL device comprises anode/hole injection layer/polymer/electron injection layer/cathode, in which the concept of a hole injection layer has first been proposed. In this case, the representative example of a polymer as a light emitting layer is polyvinyl carbazol. The hole injection layer, which is formed by adding a high electron-accepting compound to said polymer, is an electroconducting layer in which cations exist. Said hole injection layer is capable of injecting holes to said polymer upon application of an electric field.

The electron injection layer, which is formed by adding a strong electron-donating compound, is an electroconducting layer in which anions exist. Said electron injection layer is capable of injecting electrons into said polymer upon application of an electric field.

Moreover, R. H. Partridge, Polymer, Vol. 24, page 748 (1983) discloses a hole injection layer and an electron injection layer in detail, and shows that these layers are capable of injecting electrons and holes into an organic insulator at low voltages.

However, in the above process, since a metal such as Ce, which is apt to be oxidized easily, is used as a strong electron-donating compound, stable light emission cannot always be obtained. Moreover, an oxidizing agent such as $AlCl_3$ is used as an electron-accepting compound, and so stable light emission cannot be obtained because of a mobile ion such as $AlCl_3^-$ upon application of a higher voltage.

This type can be taken as one type of an MSISM (Metal Semiconductor Insulator Semiconductor Metal) type device.

Japanese Patent Publication 7635/1989 discloses a device comprising anode/hole injection zone/light emitting zone/cathode wherein a porphyrin compound is used in the hole injection zone and an organic luminescent substance having a binder polymer as a light emitting zone. This device was capable of showing a light emission of approximately 160 cd/m$^2$ at an applied voltage of approximately 30 V and at a current density of approximately 100 mA/cm$^2$. Moreover, holes were to be injected stably to the light emitting zone at a low voltage by using a porphyrin compound. However, in this device, the luminous efficiency is small at a high brightness of 50 cd/m$^2$ or more, and the maximum was about 0.018 lm/W.

Japanese Patent Application Laid-Open 194393/1984 discloses a device comprising anode/hole injection zone/light emitting zone/cathode wherein a triphenylamine derivative is used for the hole injection zone. This device was capable of showing a light emission of approximately several hundred cd/m$^2$ at an applied voltage of approximately 20 V and at a current density of approximately 100 mA/cm$^2$. Said emission characteristics could attain to the area for practical use.

It has been known that the structure of charge generation layer/charge transport layer is used as a photoconductive material (for example, Electron Photograph Gakkaishi, Vol. 25, No. 3, pages 62 to 76), and the photo conductive device has also been known, in which holes are transported using the above triphenylamine derivative in a hole transport layer in said structure of charge generation layer/charge transport layer (for example, Japanese Patent Application Laid-Open Nos. 27033/1978 and 58445/1979, and U.S. Pat. No. 4,127,412).

It has also been known that holes are injected into said charge transport layer from an electrode and transported in the transport layer upon application of an electric field (for example, U.S. Pat. No. 4,251,621, and Japanese Patent Publication No. 824/1984).

The hole injection layer disclosed in the above specification of U.S. Pat. No. 3,995,299 is an electroconducting layer, while the triphenylamine derivative used for the above charge transport layer is an insulator and has no holes to be transported by itself. However, it is clear that by using a proper anode, holes can be transported from the anode to the light emitting zone upon application of an electric field due to the properties disclosed in Japanese Patent Application Laid-Open Nos. 27033/1978 and 58445/1979, U.S. Pat. Nos. 4,251,621 and 4,127,412, and Japanese Patent Publication No. 824/1984 and such. With respect to the above, the invention described in the above Japanese Patent Application Laid-Open No. 194393/1984 was carried out. Moreover, it is proposed that electrons be accumulated in the interface between a hole injection zone and a light emitting zone and thereby the luminous efficiency of the device is increased because the hole injection zone using a triphenylamine derivative does not transport electrons (for example, Appl. Phys. Lett. Vol. 51, p. 913 (1987) and J. Appl. Phys. Vol. 65, p. 3610 (1989)).

The problem in said structure of the device is that a donating triphenylamine derivative to be used for a hole injection zone and a compound as a light emitting material to be used for the light emitting zone are apt to form exciplexes. Said exciplexes, which are formed in the interface between a hole injection zone and a light emitting zone, decrease luminous efficiency and deteriorate the interface during the action of light emission, which is one of the causes of decrease in life of a device. It is proper that the light emitting material forming no exciplexes should be selected, but the selection of the light emitting material is greatly limited, and the practical performance has been given only in a few electron-transporting light emitting layers disclosed in Japanese Patent Application Laid-Open No. 194393/1984, and so said device had a disadvantage to obtain various emission colors using an organic fluorescent material.

On the other hand, there are attempts to replace a triphenylamine derivative by another charge transport material known as the above photoconductive material (for example, the Japan Society for the Promotion of Science Photoelectric Interconversion, Committee 125, Materials for the 129th Society for Scientific Research, p. 8), but they are not always successful in the problem of life.

Moreover, the problem of exciplexes is unavoidable because light emitting material and triphenylamine or other charge transport materials easily form exciplexes for an amine component in the charge transport materials.

According to Synthetic Metals, Vol. 28, No. C, 1989, various MS junction devices wherein an electroconducting polymer is used as a semiconductor layer (S layer) are developed. Since said electroconducting polymer has a function as a semiconductor, a diode having a good rectification ratio (regular-biased current value/reverse-biased current value) is made up thereof. Particularly, according to Fish et al., since a thiophene oligomer, which is a semiconductor, can be formed into thin film by the vapor deposition method easily, it is believed that using said oligomer, an MS junction device can be prepared easily (do., p. 705, 1989). Moreover, a thiophene oligomer is usually P-type, but it is shown that it can become an N-type semiconductor by heat treatment.

However, a luminescent diode device cannot be obtained from said MS junction diode.

DISCLOSURE OF THE INVENTION

An object of the present invention is to provide an organic electroluminescence device having a novel structure of a device, which is capable of showing higher brightness and luminous efficiency in the practical field than those of a device of anode/hole injection layer/light emitting layer/cathode type using a triphenylamine derivative which is an insulator, an emission of light in the plane, and a stable emission of light, and further which can be produced easily.

Another object of the present invention is to provide an organic electroluminescence device capable of avoiding the problem of the formation of exciplexes which is unavoidable in the device using the above triphenylamine derivative as a hole injection layer, and showing various emission colors.

Further object of the present invention is to provide an organic electroluminescence device comprising an MISM type (MSISM) diode capable of showing electroluminescence, which is obtained by modifying an MS junction diode using an organic semiconductor zone.

The present invention is characterized by an organic electroluminescence device comprising a material in which an organic semiconductor zone and an organic insulator zone are sandwiched between electrodes placed on the substrate, and having an organic light emitting area in an organic insulator zone and a luminous efficiency of 0.02 lm/W or more necessary for practical use with a brightness of 50 cd/m$^2$ or more.

Moreover, in the above structure, the organic semiconductor zone means a zone having a semiconducting property (electroconducting property). The present invention is also characterized by forming said semiconductor zone using an electroconducting oligomer.

The organic insulator zone is a zone having a low electrodonductivity compared with the above organic semiconductor zone, and is formed by an organic compound. Moreover, in said zone, an electron barrier area or a hole barrier area can be prepared.

BRIEF DESCRIPTION OF DRAWINGS

FIGS. 2 to 4 are schemes showing holes and electrons moving in the above organic EL devices.

Moreover.

Referring to FIGS. 1-4 in detail, 10 is the substrate, 12 and 20 are electrodes, 14 is the organic semiconductor zone and 18 is the organic insulator zone.

THE MOST PREFERRED EMBODIMENT TO CARRY OUT THE INVENTION

Figure 1:
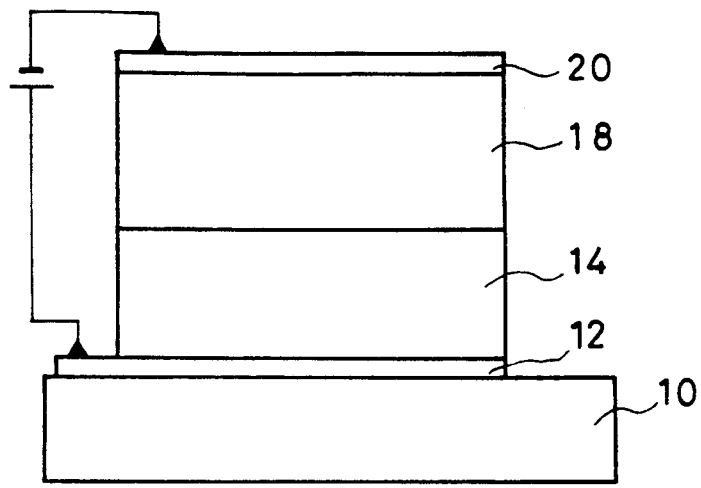
FIG. 1 is a side elevation view showing schematically an example of an organic EL device concerning the present invention.

As a specific example of the above device, the following examples of the structures of devices can be considered.

(1) anode/P-type semiconductor zone (P-S)/light emitting area (Em)/cathode
(2) anode/P-S/electron barrier area (eB)/Em/cathode
(3) anode/P-S/eB/Em/N-type semiconductor zone (N-S)/cathode
(4) anode/P-S/eB/Em/hole barrier area (hB)/N-S/cathode
(5) anode/P-S/Em/hB/cathode
L (6) anode/P-S/Em/hB/N-S/cathode
Note Em, eB and hB are contained in a insulator zone. Particularly, the devices of (3), (4) and (6) are MSISM type and considered as a developed type of MIS.

The organic electroluminescence device of the present invention is described according to each constituent.

Substrate

It is preferable to support any device described above on the substrate. The material for said substrate is not limited, and for example, glass, transparent plastic or quartz used conventionally in the organic EL device can be used.

Electrode (anode)

As the anode in the organic EL device of the present invention, a metal, an alloy, an electroconducting compound or a mixture thereof, all having a large work function (e.g., 4 eV or more), is preferably used as an electrode material. Specific examples of such electrode materials are Au, CuI, ITO, SnO$_2$ and ZnO. Said anode can be prepared, for example, by subjecting said electrode material to vapor deposition or sputtering treatment to form a thin film on its surface.

To obtain light emission from said electrode, it is preferable that the transmittance is more than 10% and the resistance of the sheet as an electrode is not more than several hundred $\Omega/\square$. Moreover, the film thickness depends on the material, usually determined in the range of not more than 500 nm, preferably 10 to 200 nm.

Electrode (cathode)

On the other hand, as the cathode, a metal, an alloy, an electroconducting compound or a mixture thereof, all having a small work function (e.g., 4 eV or less) is preferably used as an electrode material. Specific examples of such electrode materials are sodium, a sodium-potassium alloy, magnesium, lithium, a magnesium-copper mixture, Al/AlO$_3$, ytterbium and indium. Said cathode can be prepared, for example, by subjecting said electrode material to vapor deposition or sputtering treatment to form a thin film.

The resistance of the sheet as an electrode is preferably not more than several hundred Ω/□. The film thickness is usually determined in the range of not more than 500 nm, and preferably 10 to 200 nm.

In the device of the present invention, it is preferable that either anode or cathode is transparent or semitransparent, and thereby an emitted light can be transmitted and obtained with high efficiency.

Organic semiconductor zone comprising an electroconducting oligomer

It is known that a conjugated electroconducting polymer is a semiconductor in an undoped state. Polyacetylene, polythiophene, polypyrrole, polyphenylene vinylene, polyparaphenylene, polyaniline and such are synthesized by chemical synthesis or electrochemical polymerization. Among the oligomers of these electroconducting polymers or copolymers (e.g., polyphenylene vinylene), there exists a semiconductor such as a thiophene oligomer or a triphenylamine oligomer, which can be formed into thin film easily by the vapor deposition method, whereas usually a polymer cannot be formed into thin film by the vapor deposition method (Synthetic Metals, Vol. 28, p. C705, 1989, U.S. Pat. No. 4,565,860 and Synthetic Metals, Vol. 25, p.121, 1988). The thin film formed by vapor deposition has an excellent thin film forming property, a smooth surface and few pinholes, as compared with electroconducting polymers formed by electrochemical polymerization. From now on, said oligomers of electroconducting polymers or copolymers are referred to as electroconducting oligomers.

When a semiconductor zone formed by an electroconducting oligomer is used as a thin film layer preferably sandwiched between an electrode and an insulator zone, it is discovered that there occurs charge injection easily from a semiconductor zone into an insulator zone upon application of an electric field. When P-S (P-type semiconductor zone) is used, holes are injected into an insulator zone, and when N-S (N-type semiconductor zone) is used, electrons are injected into an insulator zone. When said zone is used as a thin film layer, the film thickness is preferably 10 nm to 100 nm. When it is less than 10 nm, it is difficult to form a thin film, which is not preferable.

To obtain light emission through said thin film layer, the film thickness is preferably 100 nm or less. When it is more than 100 nm, light is absorbed by said thin film and a light harvest decreases.

To form a thin film layer as a semiconductor zone, various methods of forming a thin film such as a spin coating method, a casting method, an LB method and a vacuum vapor deposition method can be used. In view of forming a uniform thin film without any pinholes, a vacuum vapor deposition method is most preferable.

When a thin film layer comprising the above semiconductor zone is formed by the vacuum vapor deposition method, the following treatment is carried out. First, a vacuum chamber is prepared, and an electrically-heated boat or a crucible is placed therein. The electrically-heated boat or the crucible can be electrically charged previously. Under these conditions, an organic compound forming a thin film layer is placed in the electrically-heated boat or crucible in the vacuum chamber. Subsequently, the vacuum chamber is evacuated to $10^{-5}$ to $10^{-3}$ Pa preferably and the above electrically-heated boat or crucible were heated electrically so that the compound may be sublimed at a vapor deposition rate of 0.01 to 50 nm by the quartz oscillator film thickness monitor. Said temperature is almost determined by the kind of an organic compound to be used, and the desired vapor deposition temperature, and in the range of 150° to 500° C. The substrate temperature is determined so that the thin film comprising the organic compound accumulated by vapor deposition may be in the desired state. It is necessary to take care that the vapor deposition temperature is not raised excessively, otherwise the organic compound decomposes, thereby affecting the performance of the semiconductor zone.

The above vapor deposition conditions are typical examples, and the specific conditions can be determined depending on the sublimation temperature of the organic compound to be used, the selection of the state of the desired thin film (e.g., microcrystalline, amorphous), the thin film forming property (flatness), and the preferred orientation of the crystal.

Among the above electroconducting oligomers, a thiophene-containing oligomer is preferable. Said oligomer can be subjected to vacuum vapor deposition. α-quinquethiophene and α-sexithiophene are particularly preferable because they can be easily formed into thin film only 100 nm or less thick. Moreover, in view of maintaining thin film, α-sexithiophene is L particularly preferable. Thiophene oligomers such as α-quinquethiophene can be synthesized according to the well-known literature (Synthetic Metals, Vol. 28, p. C705, 1989 and the literature cited therein).

The important point is that these compounds are further purified. α-quinquethiophene can be purified by recrystallization from solution, but α-sexithiophene (particularly, macromolecules, etc.) is slightly soluble and cannot be purified by recrystallization, and so it is preferable to purify using a gradient vacuum sublimation purification method (by Guttman and Lyons, Organic Semiconductor Part A, Robert Krieger Publishing Company, Florida, 1981, ch. 3).

Similarly, it is preferable to use the above sublimation purification because the oligomer as a macromolecule is slightly soluble.

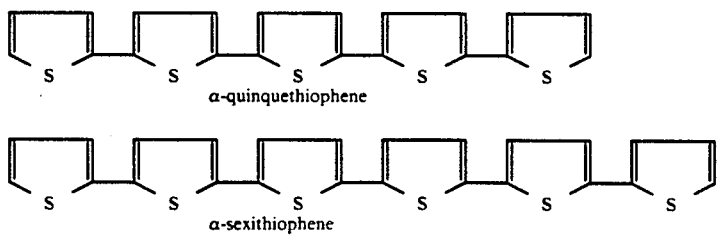

And further, to the above electroconducting oligomer, various substituents such as an alkyl group, a cyclohexyl group and an alkoxyl group can be substituted, so long as the properties of the semiconductor zone is unharmed. By said substitution, the property for forming thin film and the ease of the injection of charge from the anode and cathode can be improved (in the expectation of the ohmic junction). Particularly, by using co- polymeric oligomers, which have a wide energy gap, such as

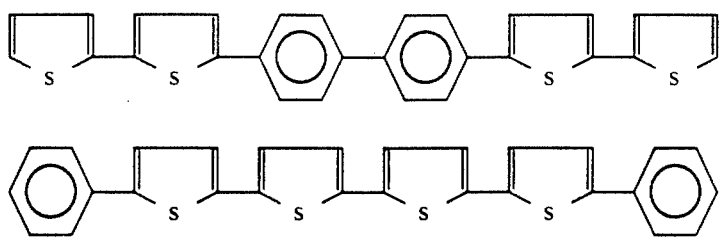

the injection of charges into an insulator zone can be improved.

Examples of the electroconducting oligomers to be used as a semiconductor zone are as follows.

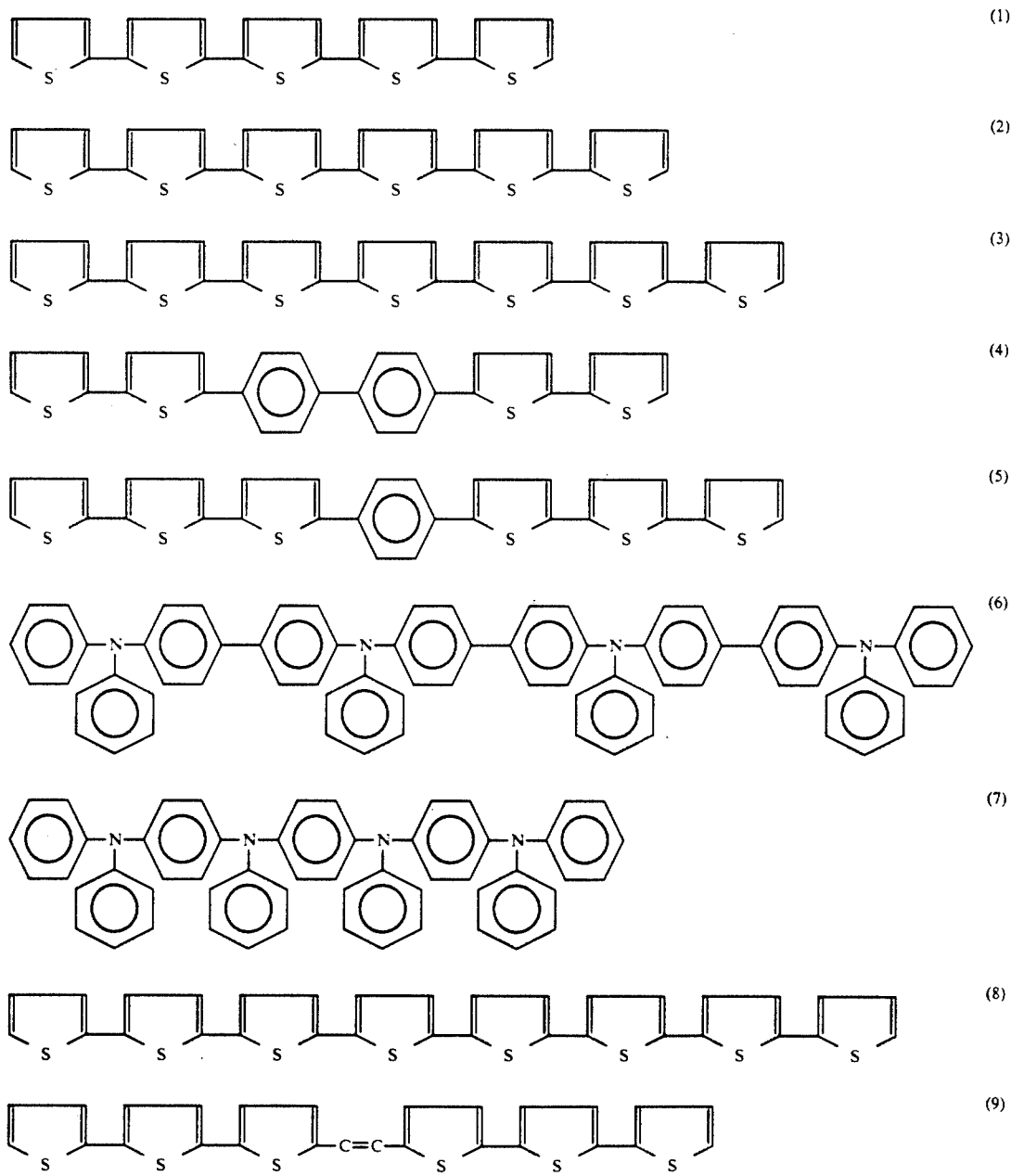

-continued

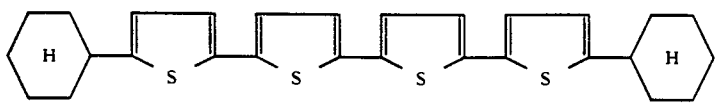 (10)

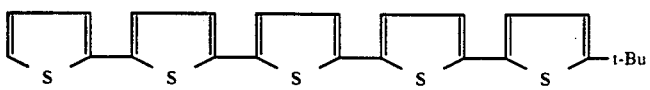 (11)

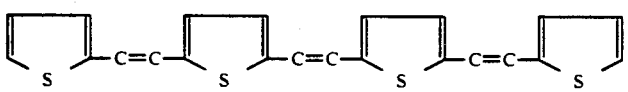 (12)

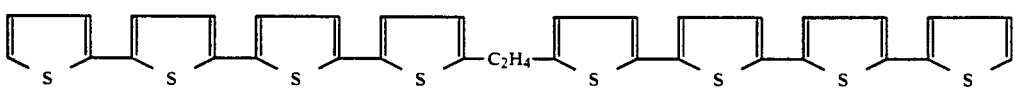 (13)

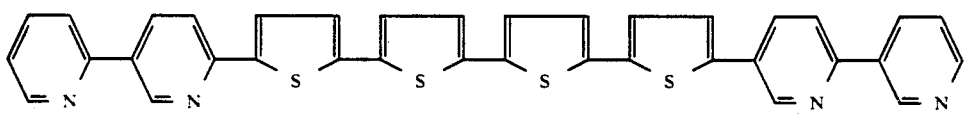 (14)

In the examples (1) to (14), the compounds containing

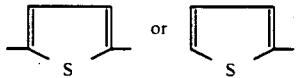

have the properties of P-type semiconductors, and the compounds containing

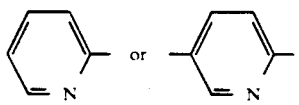

have the properties of N-type semiconductors. The above compounds (1) to (14) can be synthesized generally by the Grignard method as shown in Examples 10 and 12 (cf. Examples 10 and 12), but the compound (12) can be synthesized by the Wittig method.

Organic insulator zone

This zone has a low electroconductivity compared with a semiconductor zone. Said zone contains a light emitting area comprising an organic fluorescent compound. Said light emitting area is a thin film layer, and may be an insulator zone in contact with thin film layers as the other areas, a granular area dispersed in the other areas, and an insulator zone contaminated with the other areas. The other areas described here mean an electron barrier area or a hole barrier area.

The electron barrier area is preferably used as a thin film layer, and more preferably using a light emitting layer as a thin film layer, an electron barrier and a light emitting layer comes near to the anode in that order.

The light emitting area may be combined with an area which is not an electron barrier area, for example, an area comprising only a binding material (binder) to form an insulator zone. In that case, it is preferable to take care not to inhibit injection of charges into the light emitting area and transportation of charges therein. As an area corresponding to the above, a hole transport area only transporting holes and an electron transport area only transporting electrons exist.

Light emitting area

Said area comprises an organic compound having fluorescence in the solid state, preferably at thin film about 5 nm to 5 μm thick (light emitting layer), and further, having the following three functions.

(1) Injection function of injecting holes from outside such as a anode, P-S (P-type semiconductor zone) or eB (electron barrier area), and electrons from outside such as a cathode or N-S (N-type semiconductor zone) upon application of an electric field.

(2) Transport function of transporting injected charges by the action of an electric field.

(3) Light emitting function of providing a field for recombination of electrons and holes, thereby emitting light.

There may be a difference in ease between hole injection and electron injection, and a difference in transport ability represented by mobilities of holes and electrons.

In the above injection function, the ionization energy of the light emitting layer is preferably 6.0 eV or less in view of injecting holes relatively easily when the anode material is properly chosen. On the other hand, the electron affinity is preferably 2.5 eV or more in view of injecting electrons relatively easily when the cathode material is properly chosen.

As to the above light emitting function, it is preferable that the fluorescence in a solid state is strong. It is because such a light emitting layer has a more ability to transform the excited states of the compound itself forming it, its aggregate or its crystal into light.

The organic compound to be used in the light emitting area in the organic EL device of the present invention is not particularly limited, so long as the compound has the above properties and a thin film forming property, and any compound can be used selecting from the well-known compounds. As said organic compound, for example, a polycyclic condensation aromatic compound, a benzothiazole-, benzoimidazole-, or benzothazole-based fluorescent brightening agent, a metal-chelation oxanoide compound and distyryl benzene compound can be used.

Examples of the above polycyclic condensation aromatic compound are a condensed ring luminous substance containing anthracene, naphthalene, phenanthrene, pyrene, chrysene, and perylene skeleton and the other condensed ring luminous substances containing about 8 condensed rings.

As the above each based fluorescent brightening agent, for example, those described in Japanese Patent Application Laid-Open No. 194393/1984 can be used. Representative examples are a benzooxazole-based one such as 2,5-bis(5,7-di-t-pentyl-2-benzooxazolyl)-1,3,4-thiadiazole,
4,4′-bis(5,7-t-pentyl-2-benzooxazolyl)stilbene,
4,4′-bis[5,7-di-(2-methyl-2-butyl)-2-benzooxazolyl]stilbene,
2,5-bis(5,7-di-t-pentyl-2-benzooxazolyl)thiophene,
2,5-bis[5-(α,α-dimethylbenzyl)-2-benzooxazolyl]thiophene,
2,5-bis[5,7-di-(2-methyl-2-butyl)-2-benzooxazolyl]-3,4-diphenylthiophene, 2,5-bis(5-methyl-2-benzooxazolyl)thiophene,
4,4′-bis(2-benzooxazolyl)biphenyl, 5-methyl-2-[2-[4-(5-methyl-2-benzooxazolyl)phenyl]vinyl]benzooxazole,
2-[2-(4-chlorophenyl)vinyl]naphtho[1,2-d]oxazole; a benzothiazole-based one such as 2,2′-(p-penylenedivinylene)bisbenzothiazole; and a benzoimidazole-based one such as 2-[2-[4-(2-benzoimidazolyl]phenyl]vinyl]benzoimidazole, 2-[2-(4-carboxyphenyl)vinyl]benzoimidazole.

As the above chelate complex oxanoide compound, for example, those described in Japanese Patent Application Laid-Open No. 295695/1988 can be used. Representative examples are 8-hydroxyquinoline metal complex such as tris(8-quinolinol)aluminum, bis(8-quinolinol)magnesium, bis(benzo[f]-8-quinolinol)zinc, bis(2-methyl-8-quinolinolate)aluminumoxide, tris(8-quinolinol)indium, tris(5-methyl-8-quinolinol)aluminum, 8-quinolinol lithium, tris(5-chloro-8-quinolinol)gallium, bis(5-chloro-8-quinolinol)calcium, and poly[zinc(II)-bis(8-hydroxy-5-quinolinolyl)methane], and dilithiumepindridion.

As the above distyryl benzene compound, for example, those described in Japanese Patent Application No. 029681/1989 can be used.

Moreover, addition to the above compounds, for example, phthaloperinone derivatives (the Japan Society for the Promotion of Science Photoelectric Interconversion, Committee No. 125, Materials for the 129th Society for Scientific Research), stilbene compounds (Japanese Patent Application Nos. 312356/1987, 80257/1988 313932/1988 and 308859/1988). coumarin compounds (Japanese Patent Application Nos. 0995/1989, 054957/1989, 060665/1989, 068387/1989 and 75035/1989), and distyryl pyrazine derivatives (Japanese Patent Application No. 075936/1989) can be used as a light emitting layer.

The light emitting layer comprising the above organic compound, if necessary, may have a laminate structure having two layers or more, or may be made up of a host material and a fluorescent material as disclosed in the specification of U.S. Pat. No. 4,769,292. In this case, the host material is a thin film layer and has an injection function, a transport function, and part of a light emitting function among the functions of the light emitting area. On the other hand, the fluorescent material exists in the layer of the host material in a small amount (not more than several mol %) and has only part of a light emitting function emitting light responding to recombination of electrons and holes.

The organic compound to be used in the light emitting area may be a compound without any thin film forming properties, and for example, 1,4-diphenyl-1,3-butadiene, 1,1,4,4-tetraphenyl-1,3-butadiene, and tetraphenylcyclopentadiene can be used.

The above method of forming a semiconductor zone as a thin film layer may apply correspondingly to the method of forming a light emitting layer as a light emitting area. It is more preferable to employ a vapor deposition method. The formation of a thin film by a vapor deposition method may follow the description of forming a semiconductor zone as a thin film layer by the vapor deposition method.

Electron barrier area

Said area has a function of keeping electrons, which are being transported in Em, within Em upon application of an electric field, and comprises an organic compound having a smaller electron affinity (solid phase) than that of an organic compound of the light emitting area The difference between these two electron affinities is preferably 0.5 eV or more.

The structure of the device containing said area has a higher luminous efficiency than the above (1) and provides a device with high brightness and efficiency. The electron barrier area is preferably used as an electron barrier layer which is a thin film layer. It is noted that said electron barrier layer has an additional property of having an electron affinity of at highest 3 eV or less, preferably 2.6 eV or less, because many of light emitting layers have electron affinities of about 3 eV to keep electrons within the light emitting area adjacent to said electron barrier layer. This means that, to be a barrier to electrons, it is not always necessary to have a property of transporting no electrons and it is quite enough to have a difficulty in injecting sufficiently electrons compared with a light emitting area, and it is remarkably different from the prior art (Appl. Phys. Lett. Vol. 51, p. 913, 1987) wherein triphenylamine derivatives without any electron transport ability are needed.

As a preferable example of the material for an electron barrier area, the general formula (I) is shown below.

General formula (I):

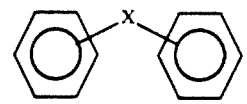

wherein X is the following A, B or C, and may be made up of the combination of A, B and C such as —A—B—A—, —B—B—A—, —C—A—B—, —C—B—B—, and —C—C—C—. Y and Y′ are —N= or —CR′=, and Z is —O—, —S— or —NR′—. R′ is a hydrogen atom, an alkyl group, an aryl group, or such.

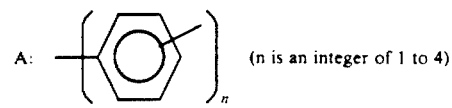

-continued

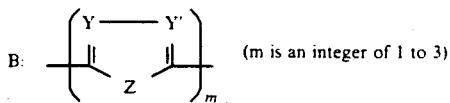

C: $+CR^1=CR^2+_n$   (n = 1, 2)

(wherein $R^1$ and $R^2$ are independently a hydrogen atom or Ar, or an alkyl group or a cyclohexyl group. Ar is an aryl group such as a phenyl group and a naphthyl group.)

Various substituents can be substituted to the compound of the above general formula (I), so long as the properties as the material for an electron barrier area are kept. Preferable substituents are an alkyl group, an aryl group and an alkoxyl group.

Moreover,

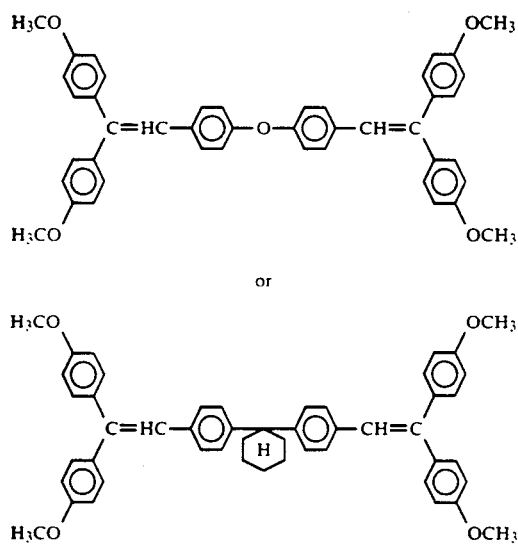

can be used as the material for an electron barrier area.

The electron barrier layer comprising the above material may be a microcrystalline thin film or amorphous, but is limited by requiring a good thin film forming property. In the case of a microcrystalline thin film, the organic crystal, so long as it is an aromatic compound, has a hole transport property (By M. Pope and C. E. Senberg. Electronic Processes in Organic Crystals, Clarenndon Press, New York, 1982, p. 337), and so it is not necessary to have such a specific molecular structure as the hole transport compound in the preceding technique has, for example, aromatic amine, and there is only one condition that it is sufficient to satisfy a definite condition of 1 he electron affinity as described above, and thereby selection ranges are remarkably extended.

The electron barrier material having a poor thin film forming property should not be used, because it does not function as a barrier layer due to pinholes.

The more important point in determination of the material for an electron barrier area is to select the one which does not form exciplexes (excited complexes) with a material for a light emitting area. In many cases, the efficiency of EL emission is decreased and the wavelength of light emission is lengthened by exciplexes. Accordingly, when an insulator zone is formed in combination as exciplexes are formed, and an MISM or MSISM device is prepared, the EL emission visible under usual illuminations can be obtained easily, but in may cases the luminous efficiency is small and unpractical.

In the structure of the device of the present invention, the material to be used for an electron barrier layer has wide selection ranges and also need not have an amine component having a donating property, and so the interface having an exciplex property between an electron barrier layer and a light emitting layer can be avoided easily to obtain a device having a large luminous efficiency. Accordingly, the selection ranges of the material for a light emitting area are extended and the possibility of realizing a device having various emissions of light such as red, blue, yellow, green, purple and orange can be provided.

The electron barrier area is preferably used as a thin film layer, and more preferably is combined with a light emitting area as a thin film layer to form an insulator zone. The above method of forming a semiconductor zone as a thin film layer may apply correspondingly to the method of forming an electron barrier area (electron barrier layer) as a thin film layer. It is more preferable to employ a vapor deposition method. To this case, the above description of forming a semiconductor zone as a semiconductor layer by the vapor deposition method may apply. In this case, the film thickness is preferably 0 nm to 50 nm, most preferably 5 nm to 30 nm.

Examples of the compound to be used for an electron barrier area are as follows.

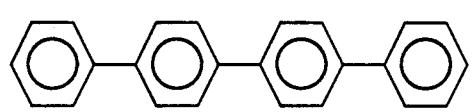
(1)

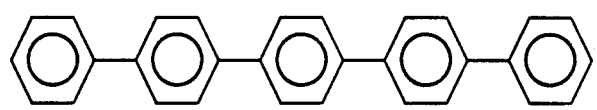
(2)

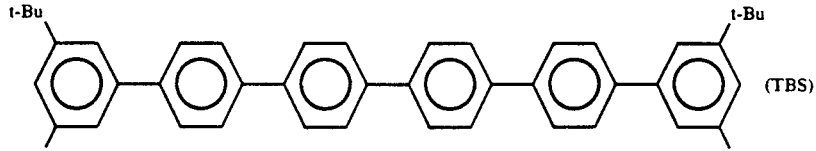
(3)

(t-Bu: tert-butyl group)

-continued
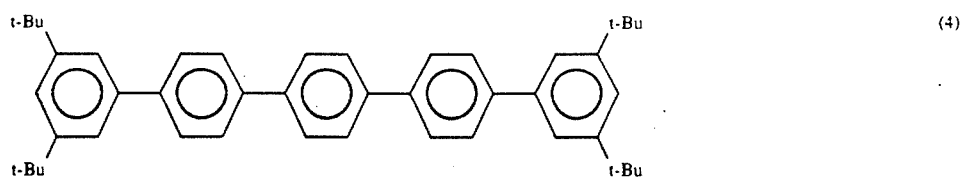
(4)
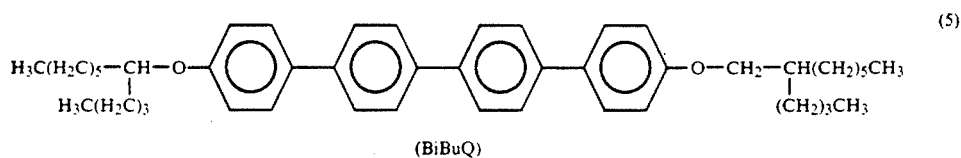
(5)
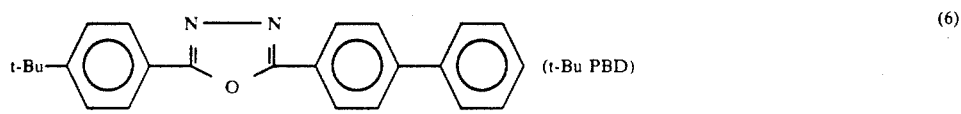
(6)
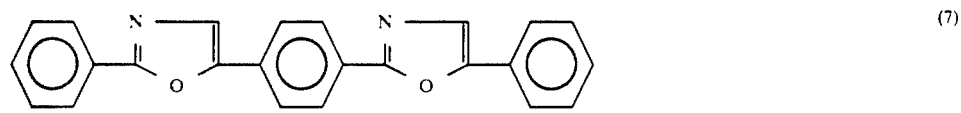
(7)
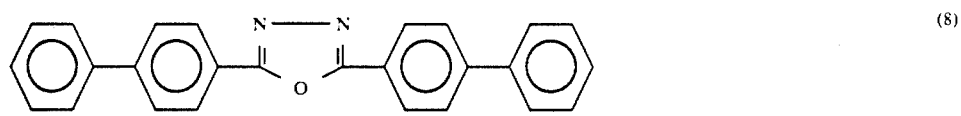
(8)
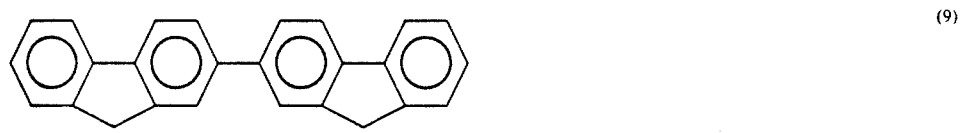
(9)
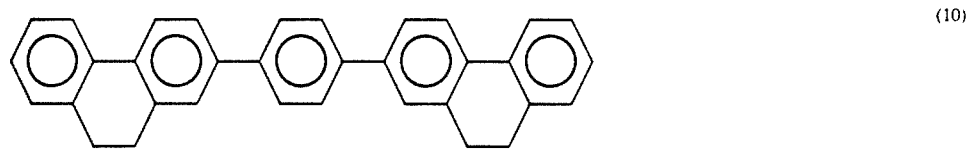
(10)
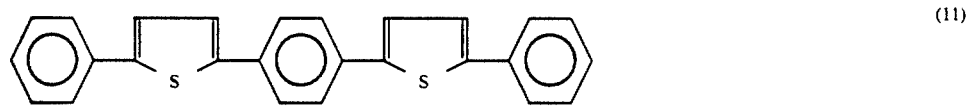
(11)
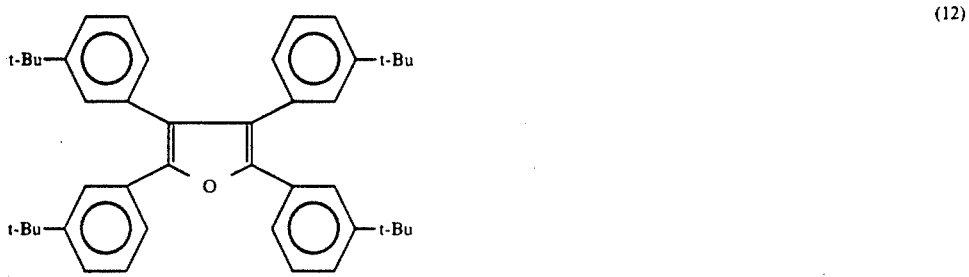
(12)

-continued

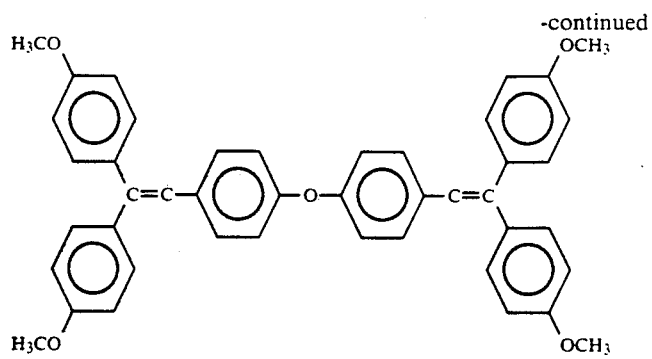 (13)

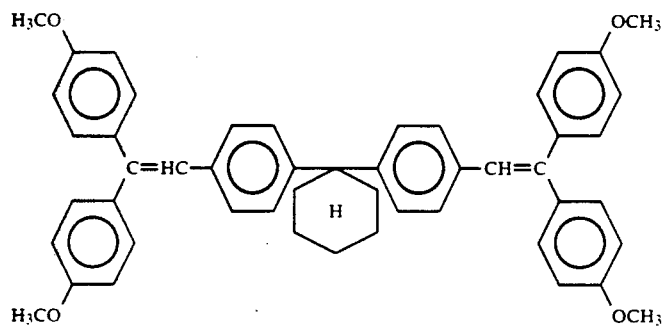 (14)

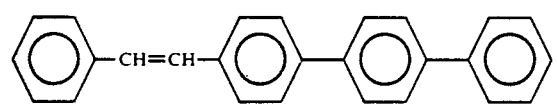 (15)

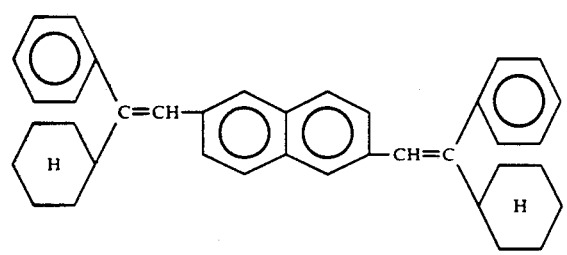 (16)

The compounds (1) to (5) are commercially available (produced by Lambda Physics Co., Ltd.) and (6) to (8) are produced by Ardrich Co., Ltd. and can be easily available. The compounds (9) and (10) are well-known and can be synthesized easily. The compounds (11) and (12) can be easily synthesized by Grignard method, and (14) to (16) by Wittig method.

Hole barrier area

As the concept to an electron barrier, there exists a hole barrier area. Said area has a function of keeping holes within Em which are being transported to the cathode in Em upon application of an electric field and comprises an organic compound having a larger ionization energy (solid state) than that of organic compound of a light emitting area. Accordingly, if an organic compound has an absolute ionization energy of at least 5.9 eV, which is larger than most compounds forming a light emitting area, it can be used. In the structure of the device containing said area, the luminous efficiency sometimes increases compared with the structure of the device (1). As a preferable example of the material for a hole barrier area, the general formula (II) is shown below.

General formula (II):

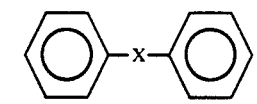

wherein X is made up of any combination of

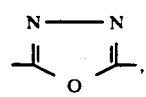 A

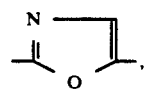 B

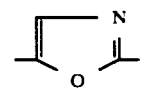 C or

-continued

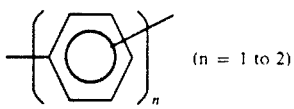
(n = 1 to 2)

—A—, —B—, —C—, —A—B—, —A—C—, —A—D—A—, —A—D—, —B—C—, —C—D—, —D—D—, and —D—C—A—.

Various substituents can be introduced to the compound of the above general formula (II), so long as its properties are maintained. Examples of the compounds to be used are as follows.

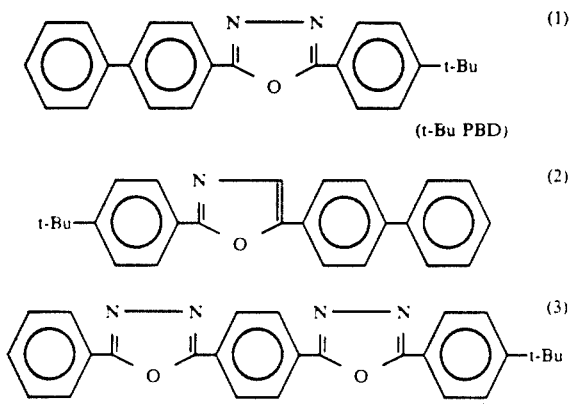

Process for production of a device

(1) Preparation of a device comprising anode/semiconductor zone/light emitting area/cathode A thin film comprising a material for a anode is formed on the proper substrate in a thickness of 1 m or less, preferably 10 to 200 nm by a vapor deposition method, a sputtering method and so on. After preparation of a anode, the material for the above semiconductor zone is formed preferably into a thin layer to prepare a semiconductor zone.

As a method of forming into thin film, a spin-coating method, a casting method or a vapor deposition method can be employed, but the vapor deposition method is most preferable to obtain an uniform and smooth film without any pinholes. When said vapor deposition method is employed, its condition is described above. The film thickness is preferably 100 nm or less in the case of observing light emission through the semiconductor zone, and to avoid the difficulty in forming a thin film, it is preferable to have a thickness of 10 nm or more.

Moreover, on said layer, a light emitting zone as a thin film is preferably prepared by the same method as in the semiconductor zone. The film thickness is preferably 5 nm to 5 m, most preferably 30 nm to 150 nm. Moreover, the material for a cathode is formed into thin film thereon by the sputtering method or the vapor deposition method to obtain the desired organic EL device having a structure of MISM.

The EL device may be formed in reverse order; a cathode, a light emitting layer, a semiconductor layer and a anode.

(2) Preparation of a device comprising anode/semiconductor zone/electron barrier area/light emitting area/cathode An anode and a semiconductor layer are formed in the same manner as in preparation of a device (1), and further, the electron barrier material is formed into thin film thereon in the same manner as in forming thin film to prepare an electron barrier layer. The film thickness is preferably 0 to 50 nm, most preferably 5 to 30 nm. Moreover, the light emitting layer and the cathode are successively formed in the same manner as in (1) to prepare the desired organic EL device.

The EL device may be formed in reverse order; a cathode, a light emitting layer, an electron barrier layer, a semiconductor layer and an anode.

(3) The device having a structure of anode/semiconductor zone/light emitting area/semiconductor zone/cathode is formed according to (1) or (2). The device having the other structures is formed according to (1) or (2).

Subsequently, the light emitting function of an organic EL device is described.

FIG. 1 shows schematically a device comprising anode/P type semiconductor zone/insulator zone/cathode as an example of an organic EL device. In said scheme, on Substrate 10, Anode 12, P-Type Semiconductor 14, Insulator Zone 18 and Cathode 20 are successively connected.

Figure 2:
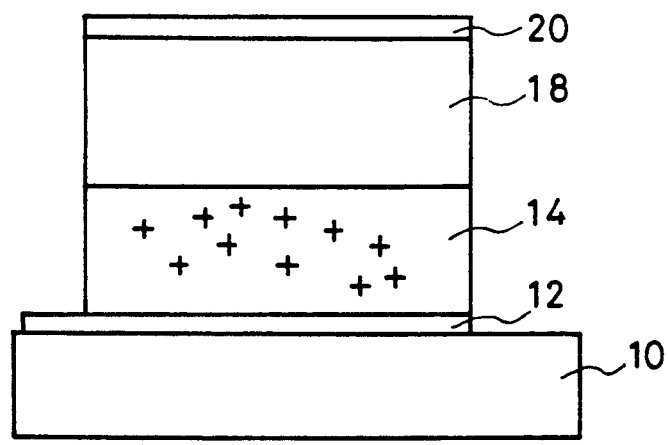

FIG. 2 shows the state that an electric field is not applied. In P-Type Semiconductor Zone 14, there exist holes (+), but in Insulator 18, there exists no charge.

FIG. 3 shows the initial state of the device upon application of a positive potential to Anode 12 and a negative potential to Cathode 20. Holes existing in P-Type Semiconductor Zone 14 are injected into Insulator Zone 18, and at the same time deficient holes are provided rapidly from Anode 12. On the other hand, electrons (−) are injected from Cathode 20 to Insulator Zone 18.

FIG. 4 shows the state just after FIG. 3. The state in FIG. 3 passes into this state immediately. Holes in Insulator Zone 18 move to the interface of Cathode 20, and at the same time electrons injected from Cathode 20 into Insulator Zone 18 move to the interface of P-Type Semiconductor Zone 14. In the transport of charges, holes and electrons meet, recombine and form excited states (indicated by =) in a light emitting area. Said excited states are dissolved by light emission and light is emitted from the device. There occur some undesirable states that holes injected from P-Type Semiconductor Zone 14 to Insulator Zone 18 pass without recombining through Insulator Zone 18 and go to Cathode 20. To avoid this, a hole barrier area adjacent to Cathode 20 may be formed in Insulator zone 18.

Moving condition of an organic EL device

When DC voltage is applied to the organic EL device of the present invention thus obtained, upon application of a voltage of 1 to 30 V with an anode as + polarity and a cathode as − polarity, emission of light is observed at the transparent or translucent electrode. When the voltage is applied with reverse polarity, the current does not flow and there occurs no emission of light because the device is a diode. When the AC voltage is applied, emission of light is observed only with the anode as + and the cathode as −. Any wave form of AC may be applied.

PREPARATION EXAMPLE 1 (PREPARATION OF α-SEXITHIOPHENE)

Synthesis was carried out according to the well-known literature (e.g., Heterocycles, Vol. 20, No. 10, p. 1937, 1983) to obtain dark-red powder. Said powder was purified by the sublimation purification method to obtain dark red powder. Said powder had a melting point of 304° to 306° C., m/e=494 by the FD mass spectrum, and was identified as α-sexithiophene.

PREPARATION EXAMPLE 2 (PREPARATION OF α-QUINQUETHIOPHENE)

Synthesis was carried out according to the well-known literature (e.g., Tetrahedron, No. 38, p. 3347, 1985) and recrystalization from a THF solution was carried out to obtain dark orange powder. Said powder had a melting point of 256.5° to 258° C., and mainly m/e=412 by the FD mass spectrum, but it was found that there were some impurity such as macromolecules. Said powder was further purified by the sublimation purification method to obtain bright orange powder, which had m/e=412 by the FD mass spectrum. There was no peak due to an impurity and said powder was identified as α-quinquethiophene.

Some examples are mentioned and described as follows, but the present invention is not limited thereby. As shown in the examples, various emissions of light with high brightness and luminous efficiency can be obtained. It is emphasized that this results from using the structure of the device of the present invention and avoiding excited complexes. Accordingly, it is clear that when the structure of the device of the present invention is employed, good results can be obtained using various materials.

EXAMPLE 1

A glass substrate (25 mm×75 mm×1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. α-sexithiophene (T6) was placed in an electrically-heated boat made of molybdenum, and further 3-(2'-N-methylbenzimidazolyl)-7-N,N-diethylaminocoumarin (KU30) was placed in another electrically-heated boat made of molybdenum. The boats were attached to the vacuum vapor deposition system.

Subsequently, the pressure of the vacuum chamber was decreased to $3 \times 10^{-4}$ Pa, the above boat containing T6 was heated to 297° C. T6 was vapor deposited on the transparent supporting substrate at a deposition rate of 0.1 to 0.3 nm/sec to prepare a semiconductor zone 20 nm thick. Moreover, the above boat containing KU30 was heated to 220° C. KU30 was vapor deposited on the semiconductor zone on the transparent supporting substrate at a deposition rate of 0.1 to 0.3 nm/sec to obtain an insulator zone (also light emitting area) 80 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa.

Subsequently, the boat containing magnesium was heated electrically, and magnesium was vapor deposited at a deposition rate of 4 to 5 nm/sec. Copper was simultaneously heated by the electron beam and vapor deposited at a deposition rate of 0.1 to 0.2 nm/sec to prepare an opposite electrode comprising a mixture of magnesium and copper.

As described above, preparation of the electroluminescence device is completed.

Upon applying a DC voltage of 10 V between electrodes with the ITO electrode as a anode and the opposite electrode comprising a mixture of magnesium and copper as a cathode, a current with a current density of 133 mA/cm$^2$ flowed and an emission of green light was obtained. The maximum wavelength was 502 nm. The CIE color coordinate was; x=0.19, y=0.49. The brightness was 136 cd/m$^2$. The luminous efficiency was 0.03 lm/W.

EXAMPLE 2

A glass substrate (25 mm×75 mm×1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. α-quinquethiophene (T5) was placed in an electrically-heated boat made of molybdenum, and further KU30 was placed in another electrically-heated boat made of molybdenum. The boats were attached to the vacuum vapor deposition system.

Subsequently, the pressure of the vacuum chamber was decreased to $2 \times 10^{-4}$ Pa, the above boat containing T5 was heated electrically. T5 was vapor deposited on the transparent supporting substrate at a deposition rate of 0.1 to 0.3 nm/sec to prepare a semiconductor zone 20 nm thick.

Moreover, the above boat containing KU30 was heated to 220° C. KU30 was vapor deposited on the semiconductor zone on the transparent supporting substrate at a deposition rate of 0.1 to 0.3 nm/sec to obtain a light emitting layer 80 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $1.2 \times 10^{-4}$ Pa.

Subsequently, the boat containing magnesium was heated, and magnesium was vapor deposited at a deposition rate of 5 to 6 nm/sec. Copper was simultaneously heated by the electron beam and vapor deposited at a deposition rate of 0.1 to 0.3 nm/sec to prepare an opposite electrode comprising a mixture of magnesium and copper.

As described above, preparation of the electroluminescence device is completed.

Upon applying a DC voltage of 5 V between electrodes with the ITO electrode as a anode and the opposite electrode comprising a mixture of magnesium and copper as a cathode, an emission of green light observed clearly under usual illuminations was obtained. However, 3 hours later the measurement was carried out and it was found that the thin film comprising T5 was white-turbid, which showed the thin film forming property was lost.

EXAMPLE 3

A glass substrate (25 mm × 75 mm × 1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. α-sexithiophene (T6) was placed in an electrically-heated boat made of molybdenum, 2-(4-biphenylyl)-5-(4-t-butylphenyl) 1,3,4-oxadiazole (t-BuPBD) was placed in another electrically-heated boat made of molybdenum, and further KU30 was placed in another boat. The boats were attached to the vacuum vapor deposition system.

Subsequently, the pressure of the vacuum chamber was decreased to $3 \times 10^{-4}$ Pa, the above boat containing T6 was heated electrically. T6 was vapor deposited on the transparent supporting substrate at a deposition rate of 0.1 to 0.3 nm/sec to prepare a semiconductor zone 20 nm thick. Moreover, the above boat containing t-BuPBD was heated to 164° C. t-BuPBD was vapor deposited on the semiconductor zone on the transparent supporting substrate to obtain an insulator zone (electron barrier area) 20 nm thick.

Moreover, the above boat containing KU30 was heated electrically. KU30 was vapor deposited on the semiconductor zone/electron barrier area on the transparent supporting substrate at a deposition rate of 0.1 to 0.3 nm/sec to obtain an insulator zone (light emitting area) 60 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa. Subsequently, the boat containing magnesium was heated electrically, and magnesium was vapor deposited at a deposition rate of 4 to 5 nm/sec. Copper was simultaneously heated by the electron beam and vapor deposited at a deposition rate of 0.1 nm/sec to prepare an opposite electrode comprising a mixture of magnesium and copper.

As described above, preparation of the electroluminescence device is completed.

Upon applying a DC voltage of 12 V between electrodes with the ITO electrode as a anode and the opposite electrode comprising a mixture of magnesium and copper as a cathode, a current with a current density of 80 mA/cm$^2$ flowed and emission of green light was obtained. The maximum wavelength of the light was 493 nm. The CIE color coordinate was: x=0.18, y=0.44. The brightness was 426 cd/m$^2$. The luminous efficiency was 0.14 lm/W.

EXAMPLE 4

A glass substrate (25 mm × 75 mm × 1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate wad dried using dry nitrogen gas and attached to the substrate holder of a commercially available vacuum vapor deposition system. α-sexithiophene (T6) was placed in an electrically-heated boat made of molybdenum, 3,5,3''''', 5'''''-tetra-t-butyl-p-sexiphenyl (TBS) was placed in another electrically-heated boat made of molybdenum, and further 1,4-bis(2,2-di-p-tolylvinyl)benzene (DTVB) was placed in another boat. The boats were attached to the vacuum vapor deposition system.

Subsequently, the pressure of the vacuum chamber was decreased to $3 \times 10^{-4}$ Pa, the above boat containing T6 was heated electrically. T6 was vapor deposited on the transparent supporting substrate at a deposition rate of 0.1 to 0.3 nm/sec to prepare a semiconductor zone 20 nm thick. Moreover, the above boat containing TBS was heated electrically. TBS was vapor deposited on the semiconductor zone on the transparent supporting substrate to obtain an insulator zone (electron barrier area) 20 nm thick. Moreover, the above boat containing DTVB was heated electrically. DTVB was vapor deposited on the semiconductor zone/electron barrier area on the transparent supporting substrate at a deposition rate of 0.1 to 0.5 nm/sec to obtain an insulator zone (light emitting area) 70 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa. Subsequently, the boat containing magnesium was heated, electrically, and magnesium was vapor deposited at a deposition rate of 4 to 5 nm/sec. Copper was simultaneously heated by the electron beam and vapor deposited at a deposition rate of 0.1 to 0.3 nm/sec to prepare an opposite electrode comprising a mixture of magnesium and copper.

As described above, preparation of the electroluminescence device is completed.

Upon applying a DC voltage of 14 V between electrodes with the ITO electrode as a anode and the opposite electrode current with a current density of 8.3 mA/cm$^2$ flowed and stable emission of bluish green light was obtained. The maximum wavelength of the light was 487 nm. The CIE color coordinate was: x=0.15, y=0.28. The brightness was 80 cd/m$^2$. The luminous efficiency was 0.22 lm/W. Moreover, when the voltage was raised to 17.5 V, the brightness was 396 cd/m$^2$ at a current density of 73 mA/cm$^2$. When the applied voltage was further raised, an emission of green light of 1000 cd/m$^2$ or more was obtained.

COMPARATIVE EXAMPLE 1

A glass substrate (25 mm × 75 mm × 1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. N,N'-bis(3-methylphenyl)-N,N'-diphenyl-[1,1'-biphenyl]-4,4'-diamine (TPD) was placed in an electrically-heated boat made of molybdenum, and KU30 was placed in another electrically-heated boat made of molybdenum. The boats were attached to the vacuum vapor deposition system.

Subsequently, the pressure of the vacuum chamber was decreased to $2 \times 10^4$ Pa, the above boat containing TPD was heated to 220° C. TPD was vapor deposited on the transparent supporting substrate in a film thickness of 100 nm at a deposition rate of 0.1 to 0.3 nm/sec. Moreover, the above boat containing KU30 was heated to 235° C. KU30 was vapor deposited on the TPD layer on the transparent supporting substrate at a deposition rate of 0.1 to 0.3 nm/sec to obtain KU30 layer 100 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa.

Subsequently, the boat containing magnesium was heated, and magnesium was vapor deposited at a deposition rate of 4 to 5 nm/sec. Copper was simultaneously heated by the electron beam and vapor deposited at a deposition rate of 0.2 to 0.3 nm/sec to prepare an opposite electrode comprising a mixture of magnesium and copper.

As described above, preparation of the electroluminescence device is completed.

Upon applying a DC voltage of 20 V between electrodes with the ITO electrode as a anode and the opposite electrode comprising a mixture of magnesium and copper as a cathode, a current with a current density of 87 mA/cm$^2$ flowed and an emission of green light was obtained. The maximum wavelength of the light was 510 nm. The brightness was 440 cd/m$^2$. The luminous efficiency was 0.08 lm/W.

COMPARATIVE EXAMPLE 2

A glass substrate (25 mm×75 mm×1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. TPD was placed in an electrically-heated boat made of molybdenum, and MPVB was placed in another electrically-heated boat made of molybdenum. The boats were attached to the vacuum vapor deposition system.

Subsequently, the pressure of the vacuum chamber was decreased to $1 \times 10^{-4}$ Pa, the above boat containing TPD was heated to 220° C. TPD was vapor deposited on the transparent supporting substrate in a film thickness of 75 nm at a deposition rate of 0.1 to 0.3 nm/sec.

Moreover, the above boat containing MPVB was heated electrically. DTVB was vapor deposited on the TPD layer on the transparent supporting substrate at a deposition rate of 0.1 to 0.2 nm/sec to obtain DTVB layer 60 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa.

Subsequently, the boat containing magnesium was heated, and magnesium was vapor deposited at a deposition rate of 1.7 to 2.8 nm/sec. Copper was simultaneously heated by the electron beam and vapor deposited at a deposition rate of 0.03 to 0.08 nm/sec to prepare an opposite electrode comprising a mixture of magnesium and copper.

As described above, preparation of the electroluminescence device is completed.

Upon applying a DC voltage of 18 V between electrodes with the ITO electrode as a anode and the opposite electrode comprising a mixture of magnesium and copper as a cathode, a current with a current density of 85 mA/cm$^2$ flowed and emission of blue light was obtained. The maximum wavelength of the light was 487 nm. The brightness was 400 cd/m$^2$. The luminous efficiency was 0.08 lm/W.

Comparing Examples 3 and 4 with Comparative Example 1 and 2, it was shown that higher luminous efficiency and brightness than in Comparative Examples were realized in Examples.

EXAMPLE 5

A glass substrate (25 mm×75 mm×1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. α-sexithiophene (T6) was placed in an electrically-heated boat made of molybdenum, TBS was placed in another electrically-heated boat made of molybdenum, and further KU30 was placed in another boat. The boats were attached to the vacuum vapor deposition system.

Subsequently, the pressure of the vacuum chamber was decreased to $3 \times 10^{-4}$ Pa, the above boat containing T6 was heated to 300° C. T6 was vapor deposited on the transparent supporting substrate at a deposition rate of 0.1 to 0.3 nm/sec to prepare a semiconductor zone 20 nm thick. Moreover, the above boat containing TBS was heated to 150° C. TBS was vapor deposited on the semiconductor zone on the transparent supporting substrate to obtain an insulator zone (electron barrier area) 20 nm thick.

Moreover, the above boat containing KU30 was heated to 220° C. KU30 was vapor deposited on the semiconductor zone/electron barrier area on the transparent supporting substrate at a deposition rate of 0.1 to 0.3 nm/sec to obtain an insulator zone (light emitting area) 60 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa. Subsequently, the boat containing magnesium was heated, electrically, and magnesium was vapor deposited at a deposition rate of 4 to 5 nm/sec. Copper was simultaneously heated by the electron beam and vapor deposited at a deposition rate of 0.1 to 0.3 nm/sec to prepare an opposite electrode comprising a mixture of magnesium and copper.

As described above, preparation of the electroluminescence device is completed.

Upon applying a DC voltage of 13 V between electrodes with the ITO electrode as a anode and the opposite electrode comprising a mixture of magnesium and copper as a cathode, a current with a current density of 60 mA/cm$^2$ flowed and emission of green light was obtained. The maximum wavelength of the light was 502 nm. The CIE color corrdinate was: x=0.22, y=0.47. The brightness was 60 cd/m$^2$. The luminous efficiency was 0.02 lm/W. The emission spectrum showed increasing strength at the bottom of long wave length, and the contribution other than emission of KU30 layer origin (assumed due to exciplexes) was observed.

EXAMPLE 6

A glass substrate (25 mm×75 mm×1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further washed by dipping in isopropyl alcohol.

Said transparent supporting substrate was dried using dry nitrogen gas and attached to the substrate holder of a commercially available vacuum vapor deposition system. α-sexithiophene (T6) was placed in an electrically-heated boat made of molybdenum, 4,4'''-bis-(2-butyloctyloxy)-p-quarterphenyl (BiBuQ) was placed in another electrically-heated boat made of molybdenum, and further KU30 was placed in another boat. The boats were attached to the vacuum vapor deposition system.

Subsequently, the pressure of the vacuum chamber was decreased to $3 \times 10^{-4}$ Pa, the above boat containing T6 was heated electrically. T6 was vapor deposited on the transparent supporting substrate at a deposition rate of 0.1 to 0.3 nm/sec to prepare a semiconductor zone 20 nm thick.

Moreover, the above boat containing BiBuQ was heated electrically. BiBuQ was vapor deposited on the semiconductor zone on the transparent supporting substrate at a deposition rate of 0.1 to 0.3 nm/sec to obtain an insulator zone (electron barrier area) 20 nm thick.

Moreover, the above boat containing KU30 was heated electrically. KU30 was vapor deposited on the semiconductor zone/electron barrier area on the transparent supporting substrate at a deposition rate of 0.1 to 0.3 nm/sec to obtain an insulator zone (light emitting area) 60 nm thick. The above substrate was at room temperature during each vapor deposition.

Subsequently, the vacuum chamber was opened and a stainless steel mask was placed on the light emitting layer. 3 g of magnesium was placed in the electrically-heated boat made of molybdenum, and copper was placed in the crucible of an electron beam vapor deposition system. The pressure of the vacuum chamber was decreased again to $2 \times 10^{-4}$ Pa. Subsequently, the boat containing magnesium was heated, electrically, and magnesium was vapor deposited at a deposition rate of 4 to 5 nm/sec. Copper was simultaneously heated by the electron beam and vapor deposited at a deposition rate of 0.1 to 0.3 nm/sec to prepare an opposite electrode comprising a mixture of magnesium and copper.

As described above, preparation of the electroluminescence device is completed.

Upon applying a DC voltage of 15 V between electrodes with the ITO electrode as a anode and the opposite electrode comprising a mixture of magnesium and copper as a cathode, a current with a current density of 100 mA/cm$^2$ or more flowed and emission of green light visible in the dark was obtained. The maximum wavelength of the light was 528 nm. Compared with the usual emission spectrum of KU30, the emission spectrum was shifted to the long wave length side, the light emitting zone width increased and the contribution of emission of exciplexes origin was observed.

EXAMPLE 7

To examine the presence of the formation of exciplexes of KU30 and TBS, or KU30 and BiBuQ, dioxane solution of each compound was made, a solution of KU30 and TBS, and a solution of KU30 and BiBuQ were each mixed, and the resulting mixtures were developed on the microplate, dried and solidified. Moreover, irradiating with the ultra violet light with a wavelength of 360 to 380 nm and examining fluorescent color, a solidified mixture of KU30 and TBS showed yellow fluorescence, but its fluorescence decreased. The fluorescence of a solidified mixture of KU30 and BiBuQ decreased markedly, and yellow fluorescence was observed.

The fluorescence of KU30, TBS and BiBuQ in a solid state was green, blue purple and purple, respectively, and the fluorescent color of the above solid mixtures showed the formation of exciplexes. The mixture of KU30 and t-BuPBD, and that of DTVB and TBS did not show the formation of exciplexes. As a result, according to Examples 3 to 7, it is preferable in increasing luminous efficiency that the compound to be used for an electron barrier area does not form exciplexes in using for a light emitting area. This is because exciplexes formed in the interface between an electron barrier area and a light emitting area cause radiation less recombination.

Moreover, Examples 3 to 7 showed that the problem of exciplexes can be avoided by selecting the material for an electron barrier area.

EXAMPLE 8

The inonization energy Ip of the compounds used for light emitting areas and electron barrier areas in Examples 1 to 7 was measured by the photo emission spectroscopy in atmosphere of AC-1 produced by Riken Instrument Co., Ltd. The energy gap Eg was determined by the photo emission measurement (by M. Pope and C. E. Swenberg, Electronic Processes in Organic Crystals, Clarennd on Press, New York, 1982, p. 207). The electron affinity Af was determined by Af=Ip-Eg. The above results are shown in Table 1.

TABLE 1

| Compound | Ip | Eg | Af |
|---|---|---|---|
| KU30 | 5.8 | 2.7 | 3.1 |

TABLE 1-continued

| Compound | Ip | Eg | Af |
| --- | --- | --- | --- |
| DTVB | 6.0 | 2.7 | 3.3 |
| TBS | 5.8 | 3.3 | 2.5 |
| t-BuPBD | 6.0 | 3.5 | 2.5 |

As shown in Table 1, the electron barrier area has a small electron affinity compared with the light emitting area, and thereby there occurs a function of keeping electrons within the light emitting layer. It is not necessary that the electron barrier area should have a property of transporting no electrons, which is different from in the hole injection zone disclosed in Japanese Patent Application Laid-Open No. 194393/1988. In fact, the EL device of ITO/TPD/KU30/t-BuPBD/Mg:Cu type showed emission with high brightness and high efficiency, which shows that electrons are transported in the t-BuPBD layer.

EXAMPLE 9

To examine that MISM devices in Examples 1 and 3 to 6 have no pinholes and function normally as a diode, the rectification ratio was measured. The forward-biased current was measured by applying forward-biased voltage V to the device, and subsequently the reverse-biased current was measured by applying reverse-biased voltage V to the device. Rectification ratio, which is defined as the value of forward-biased current to that of reverse-biased current. The results are shown in Table 2.

TABLE 2

| No. | Rectification Ratio | Applied Voltage (V) |
| --- | --- | --- |
| Example 1 | $3 \times 10^4$ | 9 |
| Example 3 | $1.5 \times 10^3$ | 9 |
| Example 4 | $1 \times 10^3$ | 17 |
| Example 5 | $7.5 \times 10^3$ | 12 |
| Example 6 | $1.5 \times 10^3$ | 15 |

Table 2 shows that the device functions as an MISM type diode device having an excellent rectification ratio of $10^3$ or more.

EXAMPLE 10

Preparation of 5,5'-bis 2-(5-cyclohexyl)thienyl bithiophene 9.32 g of 2-bromo-5-cyclohexylthiophene was dissolved in 40 ml of anhydrous tetrahydrofuran and the resulting mixture was dropped in 1.4 g of magnesium. After dropping for 15 minutes, the resulting mixture was stirred at 60° C. for 1 hour (preparation of Grignard reagent).

Subsequently, in another vessel, 4.9 g of 5,5'-dibromodithienyl was dissolved in 40 ml of anhydrous tetrahydrofuran and 0.28 g of 1,2-bis(diphenylphosphino)ethane nickel chloride was added thereto and then the Grignard reagent previously prepared was dropped thereon.

After dropping, the resulting mixture was stirred under reflux overnight. After reaction, the reaction mixture was projected into dilute aqueous hydrochloride, and the precipitated crystal was filtered off under reduced pressure and washed with 300 ml of acetone. Subsequently, the sublimation and purification was repeated twice, and the purified product was washed under stirring with 300 ml of acetone, filtered off and dried.

3.3 g (yield: 43.9%) of orangish yellow powder was obtained. The melting point was 240° C. The molecular ion peak: m/Z=494 of the desired product only was detected by the mass spectrum. The elemental analytical results and the theoretical value (Calcd.) were shown in Table 3.

TABLE 3

| Element | C | H | N |
| --- | --- | --- | --- |
| Found | 68.12 | 6.05 | — |
| Calcd. as $C_{28}H_{30}S_4$ | 67.97 | 6.11 | — |

Figure 6:
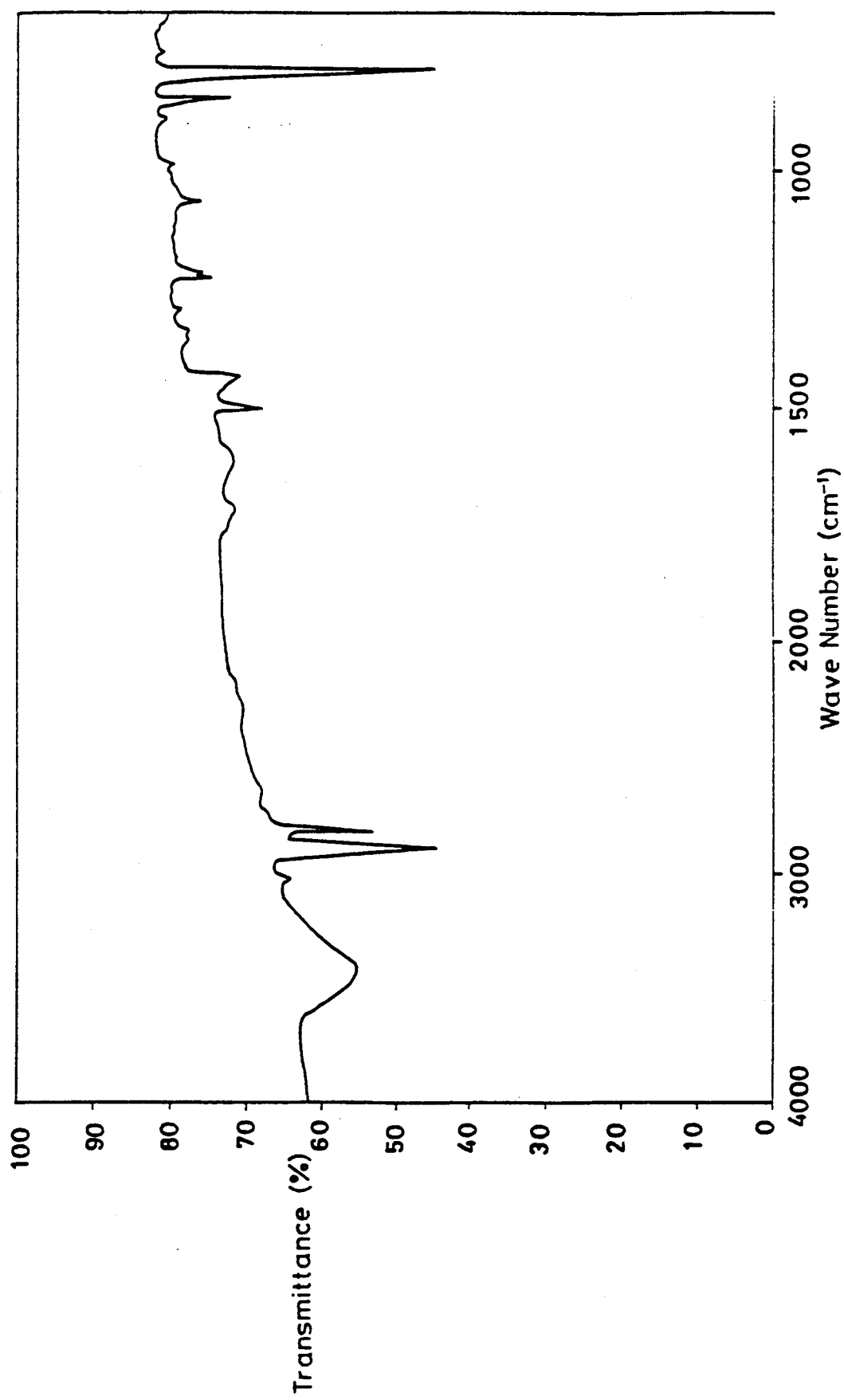
FIG. 6 shows an infrared absorption spectrum of the compound obtained in Example 10.

The infrared absorption spectrum (KBr tablet method) is shown in FIG. 6.

The above results confirm that the above yellow powder is 5,5-bis[2-(5-cyclohexyl)thienyl]bithiophene (thiophene oligomer derivative) represented by the following formula:

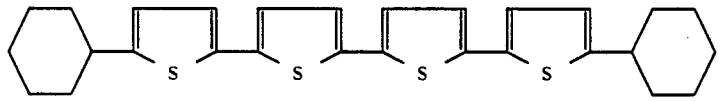

EXAMPLE 11

Proof that the compound obtained in the above Example 10 is a P type organic semiconductor A transparent glass substrate provided with ITO (produced HOYA Co., Ltd.) was dipped in isopropyl alcohol and ultrasonically washed with for 30 minutes, and further dipped in pure water and an isopropyl alcohol phase successively and then dried by blowing dry nitrogen gas. Subsequently, the above substrate was washed for 120 seconds using UV ozone washing apparatus (produced by Sumko International Co., Ltd.). The washing step was completed as above.

Subsequently, the transparent glass provided with ITO above washed was attached to the substrate holder of the vacuum vapor deposition system produced by ULVAC Co., Ltd., and further the electrically-heated boat (made of molybdenum) containing 400 md of thiophene derivative A powder [5,5'-bis{2-(5-cyclohexyl)-thienyl}bithiophene] was attached to the terminal of the vacuum vapor deposition system. Subsequently, the pressure of the vacuum chamber was decreased to $10^{-5}$ Torr, the above boats were heated electrically. The thin film 1500 Å thick was prepared by vapor deposition on the substrate at a deposition rate of 2 to 4 Å/sec. The film thickness was measured by the surface profiler (Dektak 3030, distributed by ULVAC Co., Ltd.) after the deposition. The pressure of the vacuum chamber was returned to atmospheric pressure The substrate on which the vapor deposited thin film of thiophene derivative A was formed was taken out. On said substrate, a stainless steel mask was placed, and the substrate was attached to the substrate holder again. Moreover, aluminum was placed in a tungsten filament which was another source for electrically heating and the pressure of the vacuum chamber was decreased to $10^{-5}$ Torr.

The above filament was heated electrically and an aluminum electrode 500 Å thick was prepared at a deposition rate of 1 to 4 Å/sec.

Via the above steps, a diode device laminating an ITO electrode, a thiophene derivative A layer and an Al electrode successively on the substrate was prepared. The substrate was kept at room temperature during the above steps.

Figure 5:
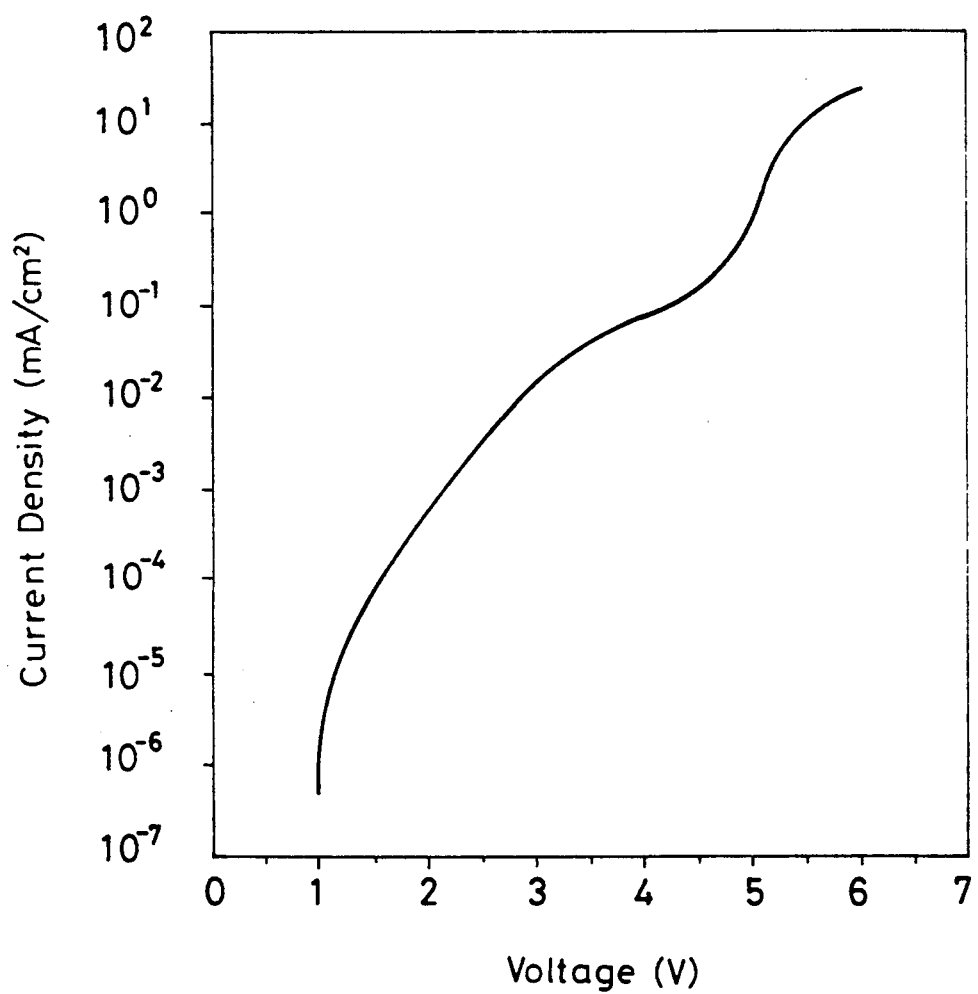
FIG. 5 is a graph showing current density-voltage characteristics of the device obtained in Example 11.

The regular current density (mA/cm$^2$) — voltage (V) characteristics were evaluated as follows. That is, raising a DC voltage every 0.2 V with an ITO electrode as an anode and an Al electrode as a cathode, the current upon application of a voltage was measured by the electrometer (Keithley electrometor 617). The measure range of voltage was 0 to 6 V. The current density-voltage obtained as a result is shown in FIG. 5. In the range of voltages 1 to 3 V there existed a straight line region (current $\alpha$ exp(voltage)) often seen in an MS diode (references, by S. M. Sze, Physics of Semiconductor, John Wiley & Sons, 1981, ed. 2, p. 89 and 262).

Subsequently, with an ITO electrode as a cathode and an Al electrode as an anode, the reverse current density of the above-voltage characteristics were evaluated. The current upon application of voltage was measured in the same manner as above. The measure range of voltage was 0 to $-6$ V. The reverse voltage is indicated by $-$.

The reverse current hardly depended on the voltage, and showed extremely small value ( $-8$ A/cm$^2$ or less). The commutating ratio at an applied voltage of $\pm 6$ V was $1.2 \times 10^{+6}$. The above results prove that the compound in the above Example 10 functions as a P-type organic semiconductor.

EXAMPLE 12

Preparation of thiophene oligomer derivative

Preparation of 4,4'-bis[5-(2,2-dithienyl)]biphenyl 10.8 g of 2-bromo-2,2'-dithienyl was dissolved in 40 ml of anhydrous tetrahydrofuran and the resulting mixture was dropped in 1.6 g of magnesium. After dropping, the resulting mixture was stirred at 60° C. for 1 hour (preparation of Grignard reagent).

Subsequently, 5.5 g of 4,4'-dibromobiphenyl was dissolved in 40 ml of anhydrous tetrahydrofuran and 0.6 g of bis(triphenylphosphine)palladium chloride and 2.37 ml of bis(isobutyl)alumino hydride were added thereto and the resulting mixture was stirred at room temperature for 30 minutes in a stream of nitrogen. After stirring, the Grignard reagent previously prepared was dropped therein, and the resulting mixture was stirred under reflux overnight.

After reaction, the reaction mixture was projected into dilute aqueous hydrochloride, and the precipitated crystal was filtered off under reduced pressure and washed with 300 ml of acetone, and further washed under stirring with 600 ml of hot benzene and filtered off. The resulting crude product was purified by sublimation twice, and further the resulting crystal was washed under stirring with 300 ml of hot benzene, filtered off and dried. As a result, 3.9 g (yield: 46%) of yellow powder was obtained. The melting point was 318° C. by the DSC analysis. The molecular ion peak: m/Z=482 of the desired product was only detected by the mass spectrum. The elemental analytical results and the theoretical value (Calcd.) were shown in Table 4.

TABLE 4

| Element | C | H | N |
|---|---|---|---|
| Found | 69.35 | 3.91 | — |
| Calcd. as C$_{28}$H$_{18}$S$_4$ | 69.67 | 3.76 | — |

Figure 8:
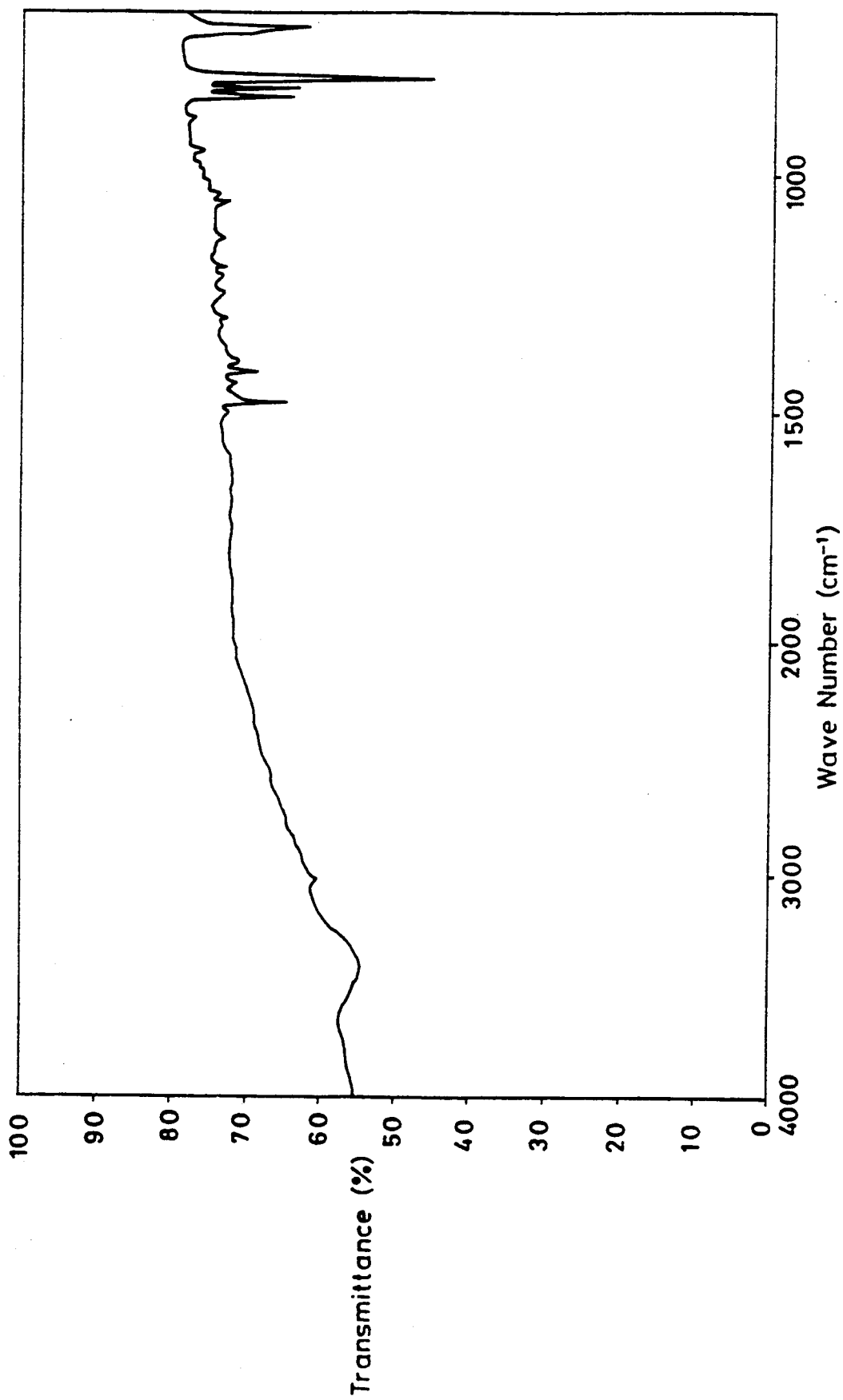
FIG. 8 shows an infrared absorption spectrum of the compound obtained in Example 12.

The infrared absorption spectrum (KBr tablet method) is shown in FIG. 8.

The above results confirm that the above yellow powder is 4,4'-bis[5-(2,2'-dithienyl)]biphenyl (thiophene oligomer derivative) represented by the following formula:

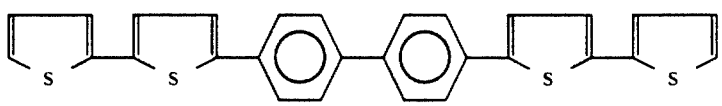

EXAMPLE 13

Figure 7:
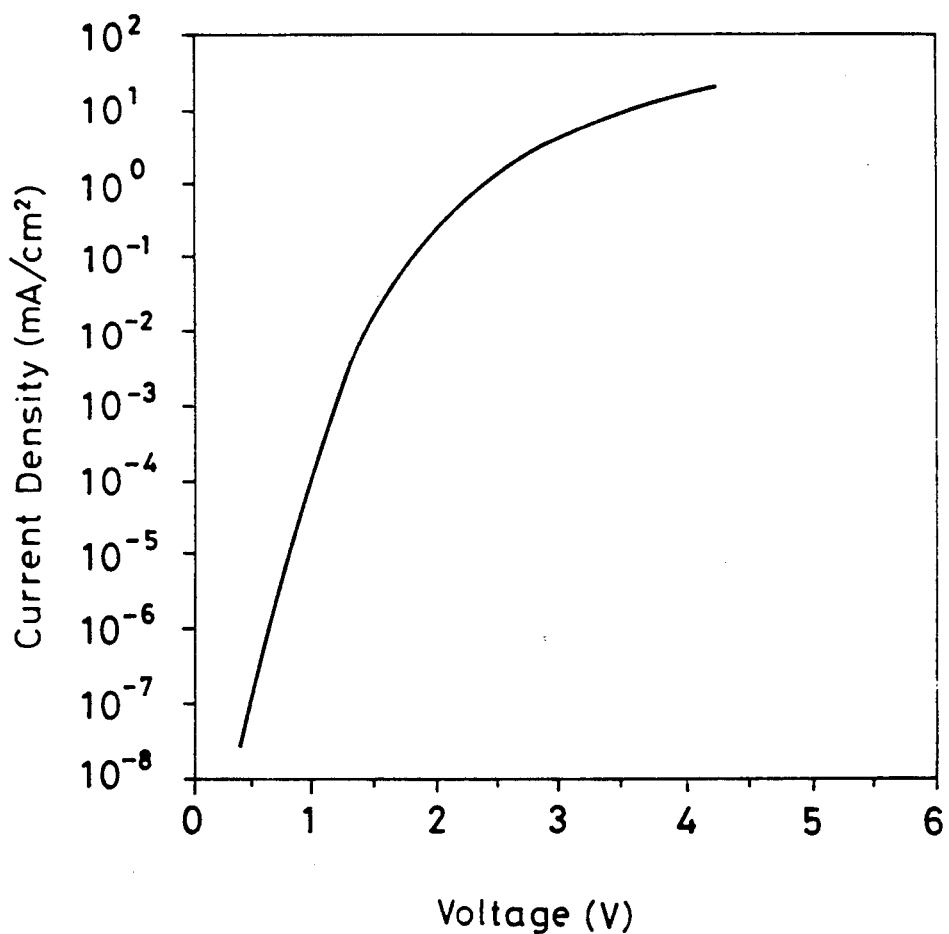
FIG. 7 is a graph showing current density-voltage characteristics of the device obtained in Example 13.

Proof that the compound obtained in the above Example 12 is a P-type organic semiconductor A diode device was prepared in the same manner as in Example 11 except that the compound obtained in the above Example 12 was used in place of the compound obtained in Example 10, the film thickness was 500 Å and the deposition rate of an Al electrode was 10 to 20 Å/sec. Moreover, the current upon application of voltage was measured in the same manner as in Example 11. The measure range of voltage was 0 to 4.2 V. The current density-voltage obtained as a result is shown in FIG. 7. Similarly, a straight line region (current $\alpha$ exp(voltage)) existed clearly at a voltage of 0.4 to 1.5 V.

Subsequently, the current upon application of a reverse voltage was measured in the same manner as in Example 11. The measure range of voltage was 0 to $-4.2$ V. The reverse voltage is indicated by $-$.

The reverse current does not depend on voltage, and showed extremely small value. For example, the current of no more than $4.0 \times 10^{-9}$ A/cm$^2$ flows at an applied voltage of $-4.2$ V, and accordingly, the commutating ratio at an applied voltage of $\pm 4.2$ V was $6 \times 10^{+6}$. The above results show that the compound obtained in Example 12 is a P-type organic semiconductor.

EXAMPLE 14

A glass substrate (25 mm$\times$75 mm$\times$1.1 mm, produced by HOYA Co., Ltd.) provided with ITO to be used as a transparent electrode 100 nm thick was used as a transparent supporting substrate. It was ultrasonically washed with isopropyl alcohol for 30 minutes, and further dipped in isopropyl alcohol. Said substrate was taken out and dried under blowing dry nitrogen gas, and then washed for 2 minutes using the UV ozone washing system (UV300, produced by Summco International Co., Ltd.).

The substrate was attached to the substrate holder of a commercially available vacuum vapor deposition system. The compound obtained in Example 12 was placed in an electrically-heated boat made of molybdenum, and an electron barrier material shown in Table 5

(Formula D) was placed in another boat, and further tris(8-quinolinol)aluminum was placed in another boat. These electrically-heated boats were attached to the vacuum vapor deposition system.

Subsequently, the pressure of the vacuum chamber was decreased to $1 \times 10^{-5}$ Torr, and the above boat containing the compound of Example 12 was heated electrically. The vapor deposition was carried out at a deposition rate of 0.1 to 0.3 nm/sec to prepare a semiconductor zone 20 nm thick. Subsequently, the above boat containing the electron barrier material shown in Table 5 (Formula D) was heated electrically. The vapor deposition was carried out at a deposition rate of 0.1 to 0.3 nm/sec to prepare an electron barrier area 40 nm thick. Moreover, the boat containing tris(8-quinolinol)aluminum was heated. The vapor deposition was carried out at a deposition rate of 0.1 to 0.2 nm/sec to prepare a light emitting layer 60 nm thick. The above substrate was at room temperature during each vapor deposition.

Subsequently, the vacuum chamber was opened and a stainless steel mask was placed on the light emitting layer. Moreover, the electrically-heated boat made of molybdenum containing magnesium was attached. Moreover, the filament type source for electrically heating containing indium was attached, and the pressure of the vacuum chamber was decreased again to $9 \times 10^{-6}$ Torr.

The boat containing magnesium was heated electrically, and Mg was vapor deposited at a deposition rate of 1 nm/sec. Simultaneously, the filament containing indium was heated, and indium was vapor deposited at a deposition rate of 0.1 nm/sec to prepare an Mg:In electrode 100 nm thick. As described above, preparation of the electroluminescence device is completed.

Upon applying a DC voltage of 7 V with ITO as an anode and Mg:In as a cathode, a current of 50 mA/cm$^2$ flowed and an emission of yellowish green light with a brightness of 920 cd/m$^2$ was obtained. The luminous efficiency was 0.83 lm/W.

EXAMPLE 15

A semiconductor zone, an electron barrier area and a light emitting layer were prepared in the same manner as in Example 14 except that t-BuPVBi (Compound *6 in Table 5) was used as a light emitting material.

Subsequently, the electrically-heated boat containing t-BuPBD, which was previously attached, was heated to prepare a hole barrier area 20 nm thick. Subsequently, an Mg:In electrode was formed in the same manner as in Example 14.

Upon applying a DC voltage of 9 V with ITO as an anode and Mg:In as a cathode, a current of 53 mA/cm$^2$ flowed and an emission of blue light with a brightness of 1200 cd/m$^2$ was obtained. The luminous efficiency was 0.8 lm/W. Said device was remarkably excellent as a blue EL device.

EXAMPLES 16 TO 20

Devices were prepared in the same manner as in Example 14 using the materials for a semiconductor zone, electron barrier and light emitting layer shown in Table 5, and similarly, upon application of a DC voltage, the current density, brightness and emission color were evaluated. The results are shown in Table 5.

TABLE 5

| Example No. | Material for Semiconductor Zone | Material for Electron Barrier Layer | Material for Light Emitting Layer | Applied Voltage (V) | Current Density (mA/cm$^2$) | Brightness (cd/m$^2$) | Emission Color |
|---|---|---|---|---|---|---|---|
| Example 16 | Compound in Example 10 | Compound of the following Formula A*1 | DTVX*5 | 10 | 160 | 280 | greenish blue |
| Example 17 | Compound in Example 12 | Compound of the following Formula A | DTVX | 12 | 80 | 150 | bluish green |
| Example 18 | α-sexithiophene | Compound of the following Formula B*2 | DTVX | 12.5 | 160 | 62 | bluish green (yellow-orangish) |
| Example 19 | Compound in Example 12 | Compound for the following Formula C*3 | t-BuPVBi*6 | 8 | 153 | 340 | blue |
| Example 20 | Compound in Example 12 | Compound for the following Formula D*4 | t-BuPVBi | 8 | 47 | 213 | greenish blue |
| Example 21 | Compound in Example 12 | Compound for the following Formula C*3 | Pe*7 | 7.5 | 120 | 700 | red |
| Example 22 | Compound in Example 12 | Compound for the following Formula C*3 | BPVP*8 | 5 | 60 | 300 | orange |

*1 Formula A

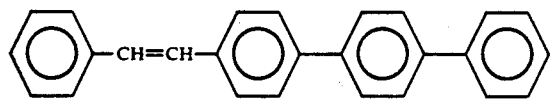

*2 Formula B

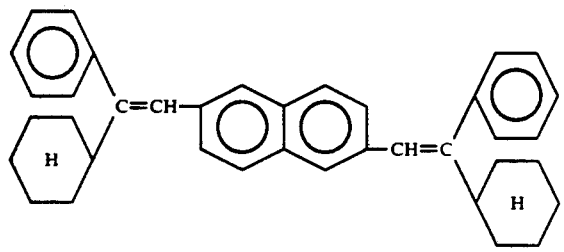

TABLE 5-continued
*³Formula C
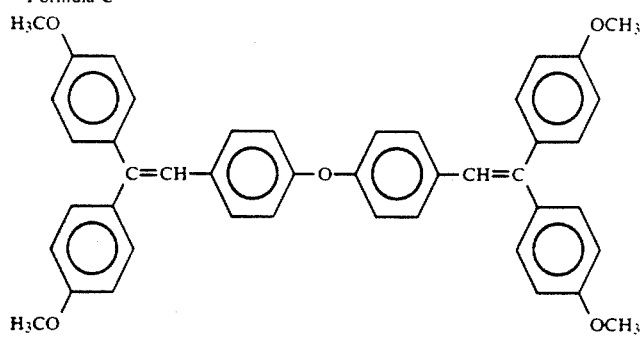
*⁴Formula D
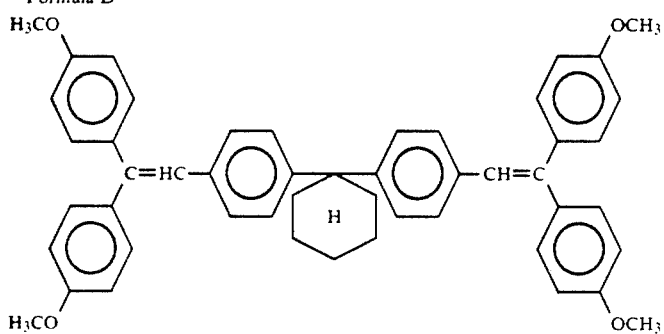
*⁵
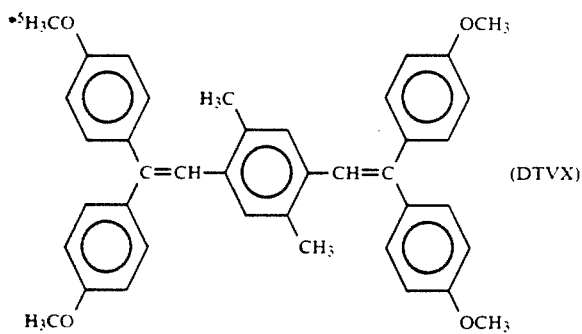
(DTVX)
*⁶
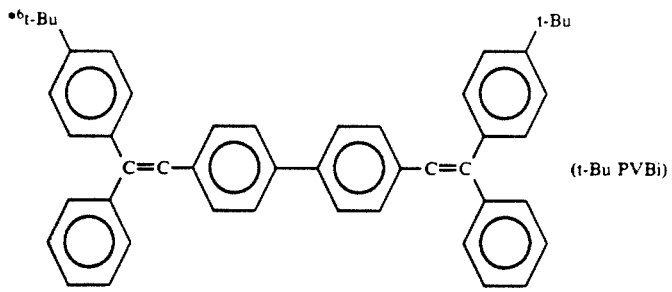
(t-Bu PVBi)
*⁷
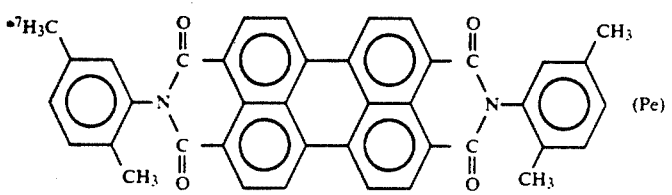
(Pe)

TABLE 5-continued

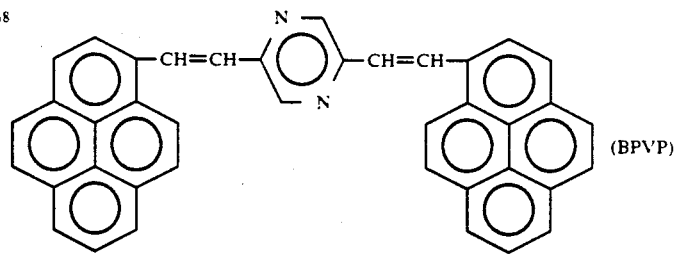
(BPVP)

POSSIBILITY FOR PRACTICAL USE

According to the present invention, an EL device with performance for practical use as well as a device of anode/hole injection later/light emitting layer/cathode type using a triphenylamine which is an insulator as a hole injection layer. Moreover, said device is capable of emitting light in the plane, has a stable emission of light, and further can be prepared easily.

Moreover, the problem of exciplexes causing decrease in luminous efficiency and lack of stability of a device can be avoided, and further a luminescence device can be realized in an MISM type organic diode device.

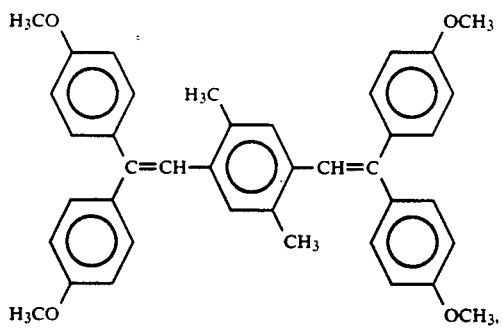

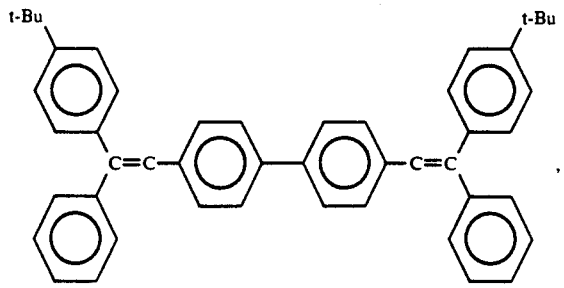

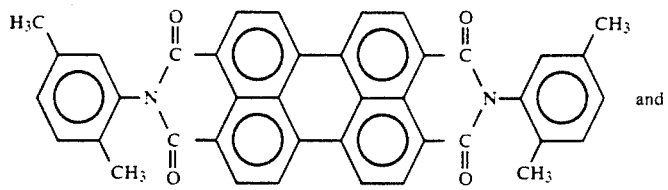
and
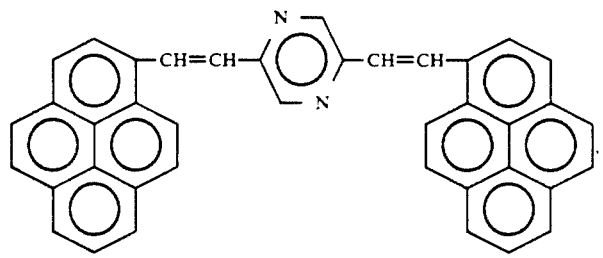
wherein t-Bu is a tert-butyl group.
13. The organic electroluminescence device according to claim 1, wherein the electroconducting oligomer is selected from the group consisting of
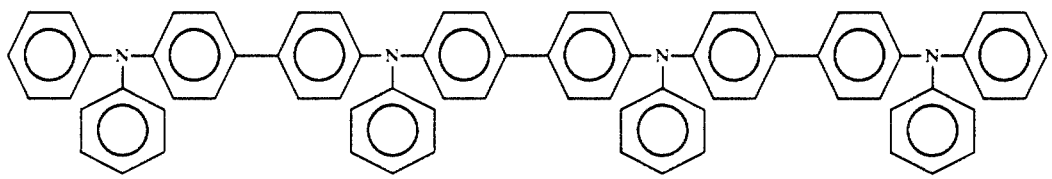
and
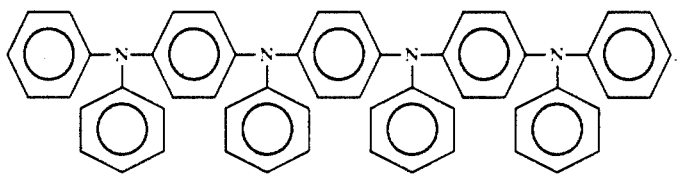

What is claimed is:

1. An organic electroluminescence device having a high brightness of 50 cd/m$^2$ or more and a luminous efficiency of 0.02 lm/W or more, comprising an organic semiconductor zone and an organic insulator zone which are sandwiched between electrodes, the organic insulator zone comprising an organic light emitting area, and the organic semiconductor zone comprising an electroconducting oligomer.

2. The organic electroluminescence device according to claim 1 wherein the organic insulator zone comprises an electron barrier area.

3. The organic electroluminescence device according to claim 1 wherein the organic insulator zone comprises a hole barrier area.

4. The organic electroluminescence device according to any one of claims 1 to 3 having a diode function with a rectification ratio of 10$^2$ or more in the working of light emission.

5. The organic electroluminescence device according to claim 1, wherein the electroconducting oligomer is a thiophene-containing oligomer in the form of a thin film having a thickness of 10 nm to 100 nm; the organic light emitting zone comprises an organic compound in the form of a thin film having a thickness of 5 nm to 5 μm, having an ionization energy of 6 eV or less and having an electron affinity of 2.5 eV or more.

6. The organic electroluminescence device according to claim 5, wherein the electroconducting oligomer is selected from the group consisting of α-quinquethiophene and α-sexithiophene.

7. The organic electroluminescence device according to claim 5, wherein the electroconducting oligomer is selected from the group consisting of

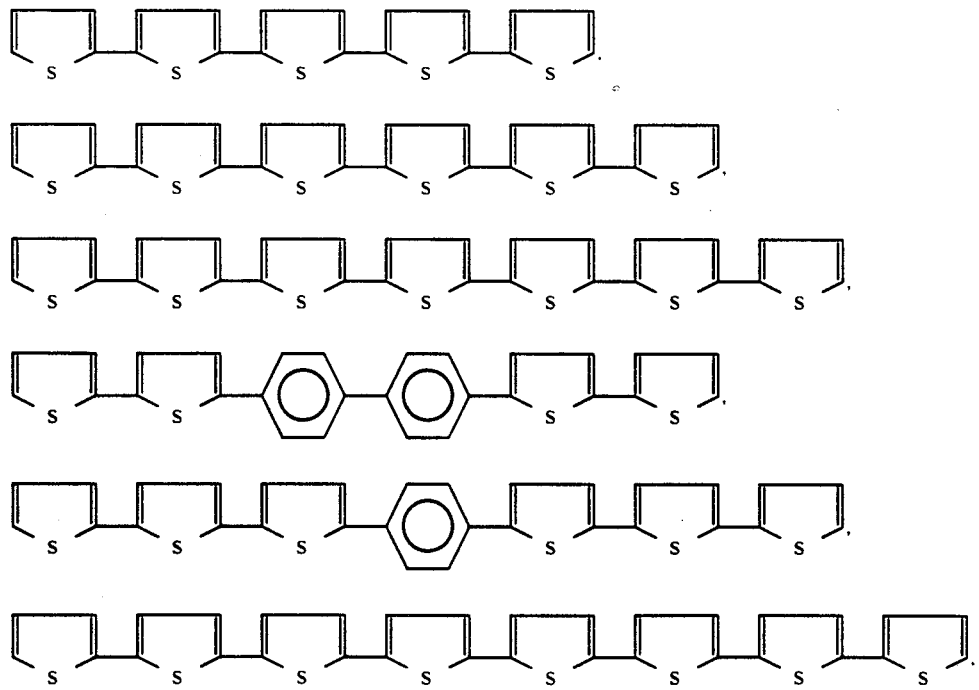

-continued

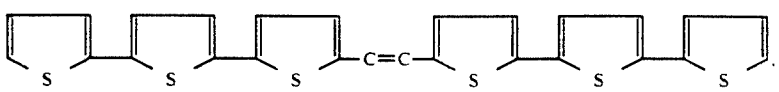

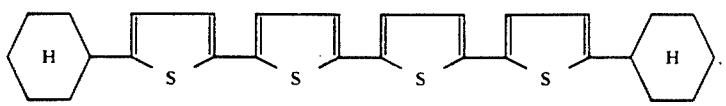

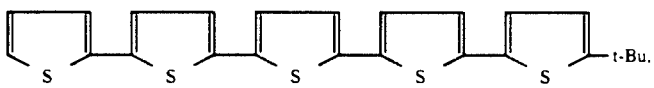

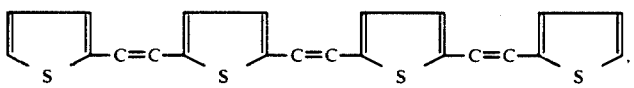

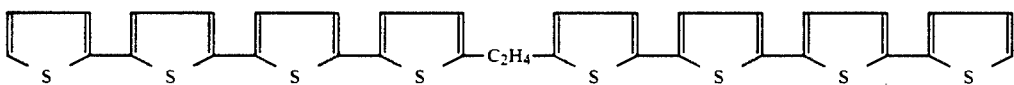

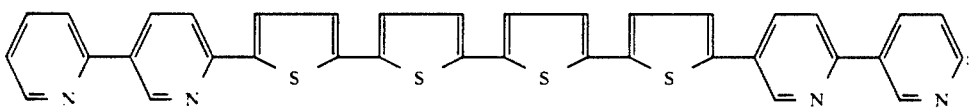

and the organic light emitting zone comprises an organic compound selected from the group consisting of
2,5-bis(5,7-di-t-pentyl-2-benzooaxazolyl)-1,3,4-thiadiazole,
4,4'-bis(5,7-t-pentyl-2-benzooxazolyl)stilbene,
4,4'-bis(5,7-di-(2-methyl-2-butyl)-2-benzooxazolyl)stilbene,
2,5-bis(5,7-di-t-pentyl-2-benzooxazolyl)thiophene,
2,5-bis(5-(α,α-dimethylbenzyl)-2-benzooxazolyl)thiophene,
2,5-bis(5,7-di-(2-methyl-2-butyl)-2-benzooxazolyl)-3,4-diphenylthiophene, 2,5-bis(5-methyl-2-benzooxazolyl)thiophene,
4,4'-bis(2-benzooxazolyl)biphenyl, 5-methyl-2-(2-(4-(5-methyl-2-benzooxazolyl)phenyl)vinyl)benzooxazole,
2-(2-(4-chlorophenyl)vinyl)naptho(1,2-d)oxazole,
2,2'-(p-penylenedivinylene)-bisbenzothiazole,
2-(2-(4-(2-benzoimidazolyl)phenyl)vinyl)benzoimidazole,
2-(2-(4-carboxyphenyl)vinyl)benzoimidazole, tris(8-quinolinol)aluminum, bis(8-quinolinol)magnesium, bis(benzo(f)-8-quinolinol)zinc, bis(2-methyl-8-quinolinolate)aluminumoxide, tris(8-quinolinol)indium, tris(5-methyl-8-quinolinol)aluminum, 8-quinolinol lithium, tris(5-chloro-8-quinolinol)gallium, bis(5-chloro-8-quinolinol)calcium, poly(zinc(II)-bis(8-hydroxy-5-quinolinolyl)methane), dilithiumepindridion, distyryl benzene compounds and a polycyclic condensation aromatic compound comprising a condensed ring luminous substance comprising anthracene, naphthalene, phenanthrene, pyrene, chrysene and a perylene skeleton.

8. The organic electroluminescence device according to claim 7, wherein the organic insulator zone comprises an electron barrier area comprising a compound of the formula

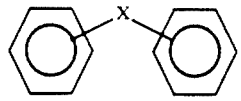

wherein X is at least one of the following (I), (II) and (III) in any of the following combinations of (I), (II) and (III):

—(I)—(II)—(I)—,    —(II)—(II)—(I)—,    13
(III)—(I)—(II)—,    —(III)—(II)—(II)— and
—(III)—(III)—(III)—, (I): 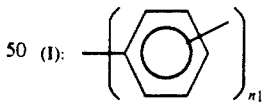    $n_1$ is an interger of 1 to 4

(II): $\left(\begin{array}{c} Y \text{------} Y' \\ \| \quad \| \\ Z \end{array}\right)_m$    m is an interger of 1 to 3

(III): $+CR^1{=}CR^2{\overline{n_2}}$    $n_2$ is 1 or 2,

Y and Y' are —N= or —CR'=, Z is —O—, —S— or —NR'—,
R' is a hydrogen atom, an alkyl group or an aryl group,
$R^1$ and $R^2$ are independently at least one of a hydrogen atom, Ar, an alkyl group and a cyclohexyl group, and Ar is at least one of a phenyl group and a naphthyl group.

9. The organic electroluminescence device according to claim 7, wherein the organic insulator zone comprises an electron barrier area comprising a compound selected from the group consisting of
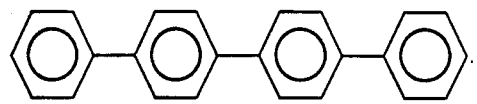
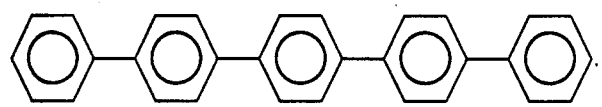
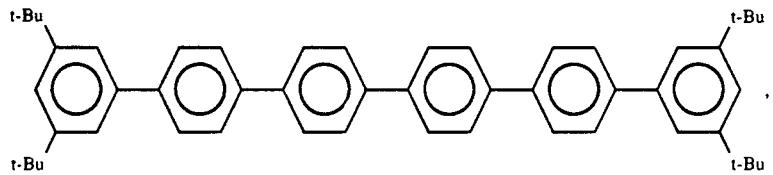
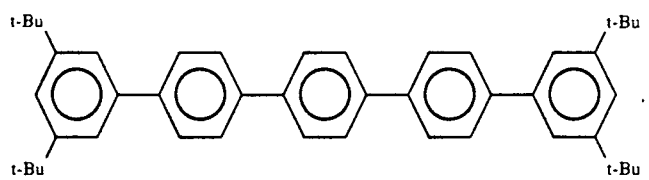
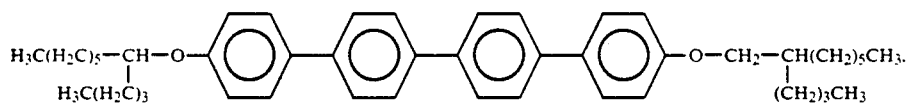
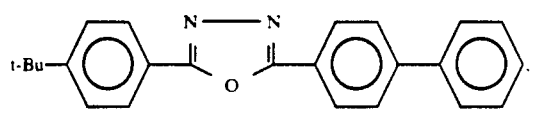
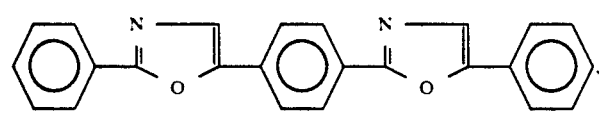
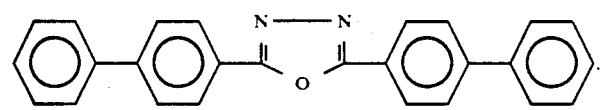
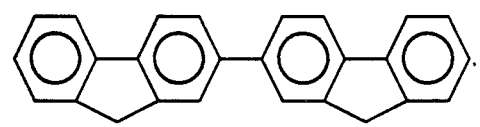
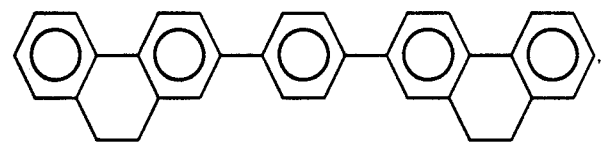
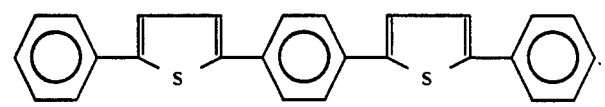

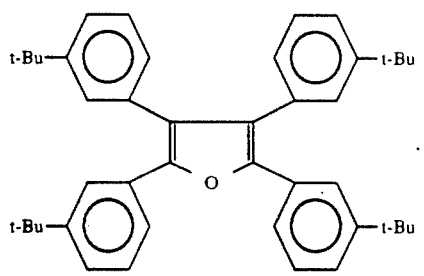
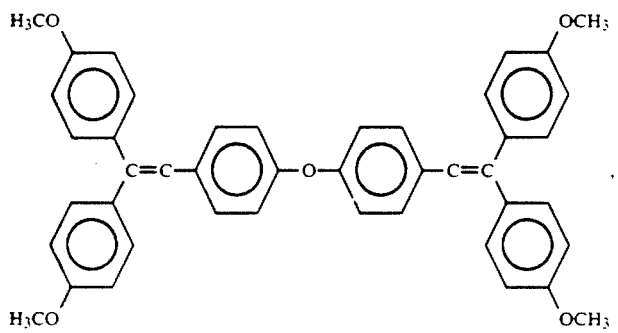
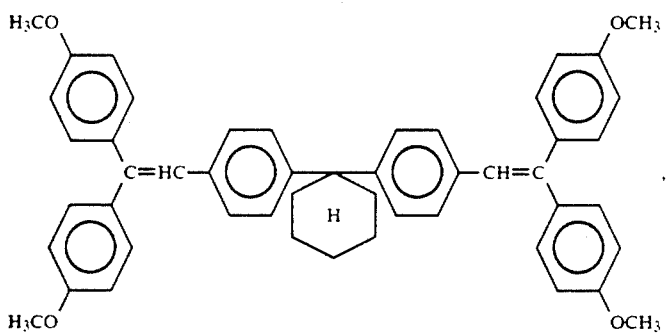
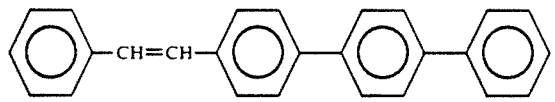
and
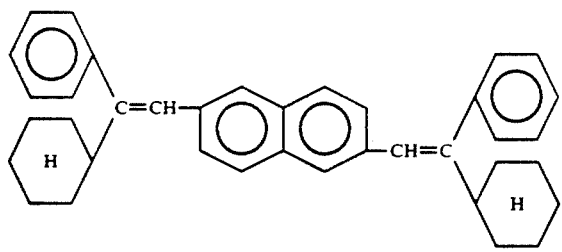
wherein t-Bu is a tert-butyl group.
10. The organic electroluminescence device according to claim 7, wherein the organic insulator zone comprises a hole barrier area comprising an organic compound having an absolute ionization energy of at least 5.9 eV and having the formula
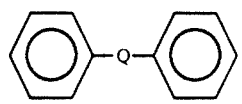
wherein Q is at least one of —(A)—, —(B)—, —(C)—, —(A)—(B)—, —(A)—(C)—, —(A)—(D)—(A)—, —(A)—(D)—, —(B)—(C)—, —(C)—(D)—, —(D)—(D)— and —(D)—(C)—(A)—,
wherein
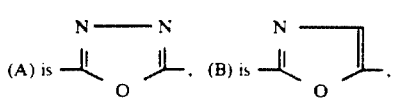

-continued (C) is 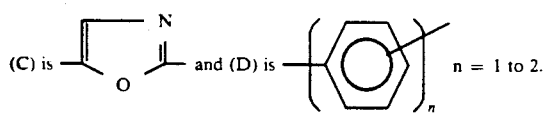 and (D) is n = 1 to 2.

11. The organic electroluminescence device according to claim 10, wherein the hole barrier area comprises an organic compound selected from the group consisting of

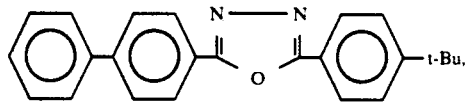

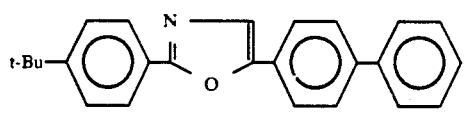

and

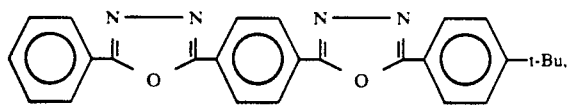

wherein t-Bu is a tert-butyl group.

12. The organic electroluminescence device according to claim 2, wherein the organic semiconductor zone comprises a compound selected from the group consisting of α-sexithiophene, 5,5'-bis-2-(5-cyclohexyl)thienyl bithiophene and 4,4'-bis(5-(2,2-dithienyl))biphenyl; the electron barrier area comprises a compound selected from the group consisting of

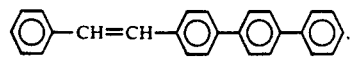

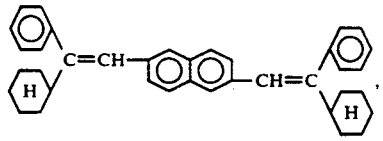

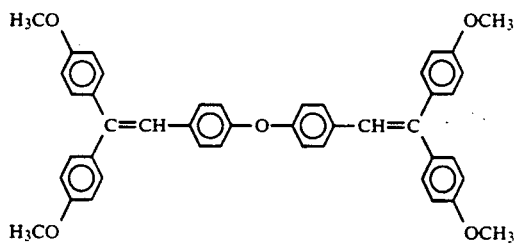

and

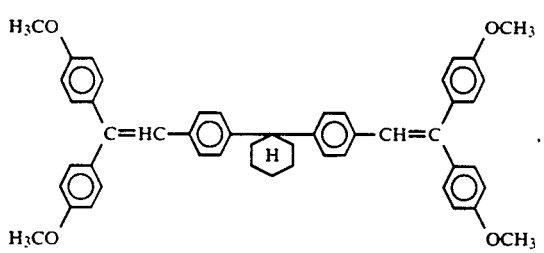

and the organic light emitting area comprises a compound selected from the group consisting of